US012725025B2

(12) United States Patent
Li

(10) Patent No.: US 12,725,025 B2
(45) Date of Patent: Sep. 1, 2026

(54) COMPUTATION IN MEMORY (CIM) ARCHITECTURE AND DATAFLOW SUPPORTING A DEPTH-WISE CONVOLUTIONAL NEURAL NETWORK (CNN)

(71) Applicant: QUALCOMM Incorporated, San Diego, CA (US)

(72) Inventor: Ren Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 943 days.

(21) Appl. No.: 17/361,784

(22) Filed: Jun. 29, 2021

(65) Prior Publication Data

US 2022/0414444 A1 Dec. 29, 2022

(51) Int. Cl.

| | |
|---|---|
| ***G06N 3/065*** | (2023.01) |
| ***G06N 3/048*** | (2023.01) |
| ***G11C 11/413*** | (2006.01) |
| ***H03M 1/36*** | (2006.01) |

(52) U.S. Cl.
CPC ............. *G06N 3/065* (2023.01); *G06N 3/048* (2023.01); *G11C 11/413* (2013.01); *H03M 1/36* (2013.01)

(58) Field of Classification Search
CPC ...... G06N 3/065; G06N 3/048; G11C 11/413; H03M 1/36
See application file for complete search history.

(56) References Cited

U.S. PATENT DOCUMENTS

| | | | | |
|---|---|---|---|---|
| 2020/0090030 A1 | 3/2020 | Huang et al. | | |
| 2020/0117986 A1* | 4/2020 | Burr | ...................... | G06F 7/5443 |
| 2020/0184315 A1 | 6/2020 | Kim et al. | | |
| 2020/0218963 A1* | 7/2020 | Yasuda | .................. | G06N 3/048 |

(Continued)

FOREIGN PATENT DOCUMENTS

| | | |
|---|---|---|
| CN | 111222626 A | 6/2020 |
| JP | 2021068454 A | 4/2021 |
| WO | 2020197510 A1 | 10/2020 |

OTHER PUBLICATIONS

Yan et al., "Efficient Allocation and Heterogeneous Composition of NVM Crossbar Arrays for Deep Learning Acceleration," 2018 IEEE 37th International Performance Computing and Communications Conference (IPCCC), Orlando, FL, USA, 2018, pp. 1-8 (Year: 2018).*

(Continued)

*Primary Examiner* — Miranda M Huang
*Assistant Examiner* — Yao David Huang
(74) *Attorney, Agent, or Firm* — Patterson + Sheridan LLP

(57) ABSTRACT

Certain aspects provide an apparatus for signal processing in a neural network. The apparatus generally includes a first set of computation in memory (CIM) cells configured as a first kernel for a neural network computation, the first set of CIM cells comprising on one or more first columns and a first plurality of rows of a CIM array, and a second set of CIM cells configured as a second kernel for the neural network computation, the second set of CIM cells comprising on one or more second columns and a second plurality of rows of the CIM array. In some aspects, the one or more first columns are different than the one or more second columns, and the first plurality of rows are different than the second plurality of rows.

11 Claims, 15 Drawing Sheets

(56) References Cited

U.S. PATENT DOCUMENTS

| | | | | |
|---|---|---|---|---|
| 2020/0364577 | A1* | 11/2020 | Le Gallo-Bourdeau | G06N 3/084 |
| 2020/0411091 | A1* | 12/2020 | Hwang | G06N 3/065 |
| 2021/0073317 | A1* | 3/2021 | Dazzi | G06N 3/063 |
| 2021/0073650 | A1 | 3/2021 | Reisser et al. | |
| 2021/0089865 | A1 | 3/2021 | Wang et al. | |
| 2021/0327474 | A1* | 10/2021 | Seok | G11C 11/419 |
| 2021/0374514 | A1* | 12/2021 | Tsai | G06N 3/084 |
| 2022/0012303 | A1* | 1/2022 | Zheng | G06F 17/16 |
| 2022/0092393 | A1* | 3/2022 | Aguiar | G06F 7/5443 |
| 2022/0129519 | A1* | 4/2022 | Zheng | G06F 17/16 |
| 2022/0138579 | A1* | 5/2022 | Rasch | G06N 3/045 706/25 |
| 2022/0156045 | A1* | 5/2022 | Nazar | G06F 7/523 |

OTHER PUBLICATIONS

Angizi et al., "DIMA: A Depthwise CNN In-Memory Accelerator," ICCAD '18, Nov. 5-8, 2018, San Diego, CA, USA (Year: 2018).*

Yu et al., "A Logic-Compatible eDRAM Compute-In-Memory With Embedded ADCs for Processing Neural Networks," in IEEE Transactions on Circuits and Systems I: Regular Papers, vol. 68, No. 2, pp. 667-679, Feb. 2021 (Year: 2021).*

Bai et al., "A Cnn Accelerator on FPGA Using Depthwise Separable Convolution," in IEEE Transactions on Circuits and Systems II: Express Briefs, vol. 65, No. 10, pp. 1415-1419, Oct. 2018 (Year: 2018).*

Zhu et al., "Mixed Size Crossbar based RRAM CNN Accelerator with Overlapped Mapping Method," ICCAD '18, Nov. 5-8, 2018, San Diego, CA, USA (Year: 2018).*

Zhang et al., "Efficient and Robust RRAM-Based Convolutional Weight Mapping With Shifted and Duplicated Kernel," in IEEE Transactions on Computer-Aided Design of Integrated Circuits and Systems, vol. 40, No. 2, pp. 287-300, Feb. 2021 (Year: 2021).*

Peng et al., "Optimizing Weight Mapping and Data Flow for Convolutional Neural Networks on Processing-in-Memory Architectures, " in IEEE Transactions on Circuits and Systems I: Regular Papers, vol. 67, No. 4, pp. 1333-1343, Apr. 2020 (Year: 2020).*

Gudaparthi et al., "Moving CNN Accelerator Computations Closer to Data," 2018 1st Workshop on Energy Efficient Machine Learning and Cognitive Computing for Embedded Applications (2018) (Year: 2018).*

Gopalakrishnan et al., "HFNet: A CNN Architecture Co-designed for Neuromorphic Hardware With a Crossbar Array of Synapses," Front. Neurosci. 14:907. doi: 10.3389/fnins.2020.00907 (Year: 2020).*

Peng et al., "Inference Engine Benchmarking Across Technological Platforms from CMOS to RRAM," MEMSYS '19, Sep. 30-Oct. 3, 2019, Washington, DC, USA (Year: 2019).*

Chen J., et al., "Multiply Accumulate Operations in Memristor Crossbar Arrays for Analog Computing", Journal of Semiconductors, [Online], vol. 42, No. 1, Jan. 1, 2021, 23 Pages, XP055972596, GB, CN ISSN: 1674-4926, DOI:10.1088/1674-4926/42/1/013104, figures 8(e), 13(a) figures 5 (f), 6 (c), 10 (a).

Gao L., et al., "Demonstration of Convolution Kernel Operation on Resistive Cross-Point Array," IEEE Electron Device Letters, vol. 37, No. 7, Jul. 1, 2016, IEEE, pp. 870-873, XP011615176, ISSM: 0741-3106, DOI: 10.1109/LED.2016.2573140, figure 1 (c).

International Search Report and Written Opinion—PCT/US2022/073230—ISA/EPO—Nov. 2, 2022.

Shaahin A., et al., "DIMA: A Depthwise CNN In-Memory Accelerator", 2018 IEEE/ACM International Conference on Computer-Aided Design (ICCAD), ACM, Nov. 5, 2018 (Nov. 5, 2018), pp. 1-8, XP033487827, DOI: 10.1145/3240765.3240799 [Retrieved on Dec. 24, 2018] Abstract, figures 3-4 section 3, p. 3-p. 5, The whole document.

Sie S., et al., "MARS: Multi-Macro Architecture SRAM CIM-Based Accelerator with Co-designed Compressed Neural Networks", arxiv.org, Cornell University Library, 201 Olin Library Cornell University Ithaca, NY 14853, Oct. 24, 2020, 11 Pages, XP081799358, Figure 4.

Taiwan Search Report—TW111124296—TIPO-Jan. 16, 2026.

* cited by examiner

1300

Load, via one or more first columns, a first set of compute-in memory (CIM) cells with a first plurality of weight parameters for a first kernel filter to perform a neural network computation, the first set of CIM cells comprising the one or more first columns and a first plurality of rows of a CIM array

1305

Load, via one or more second columns, a second set of CIM cells with a second plurality of weight parameters of a second kernel filter to perform the neural network computation, the second set of CIM cells comprising the one or more second columns and a second plurality of rows of the CIM array, wherein the one or more first columns are different than the one or more second columns, and wherein the first plurality of rows are different than the second plurality of rows

1310

Perform the neural network computation by applying first activation inputs to the first plurality of rows and second activation inputs to the second plurality of rows.

1315

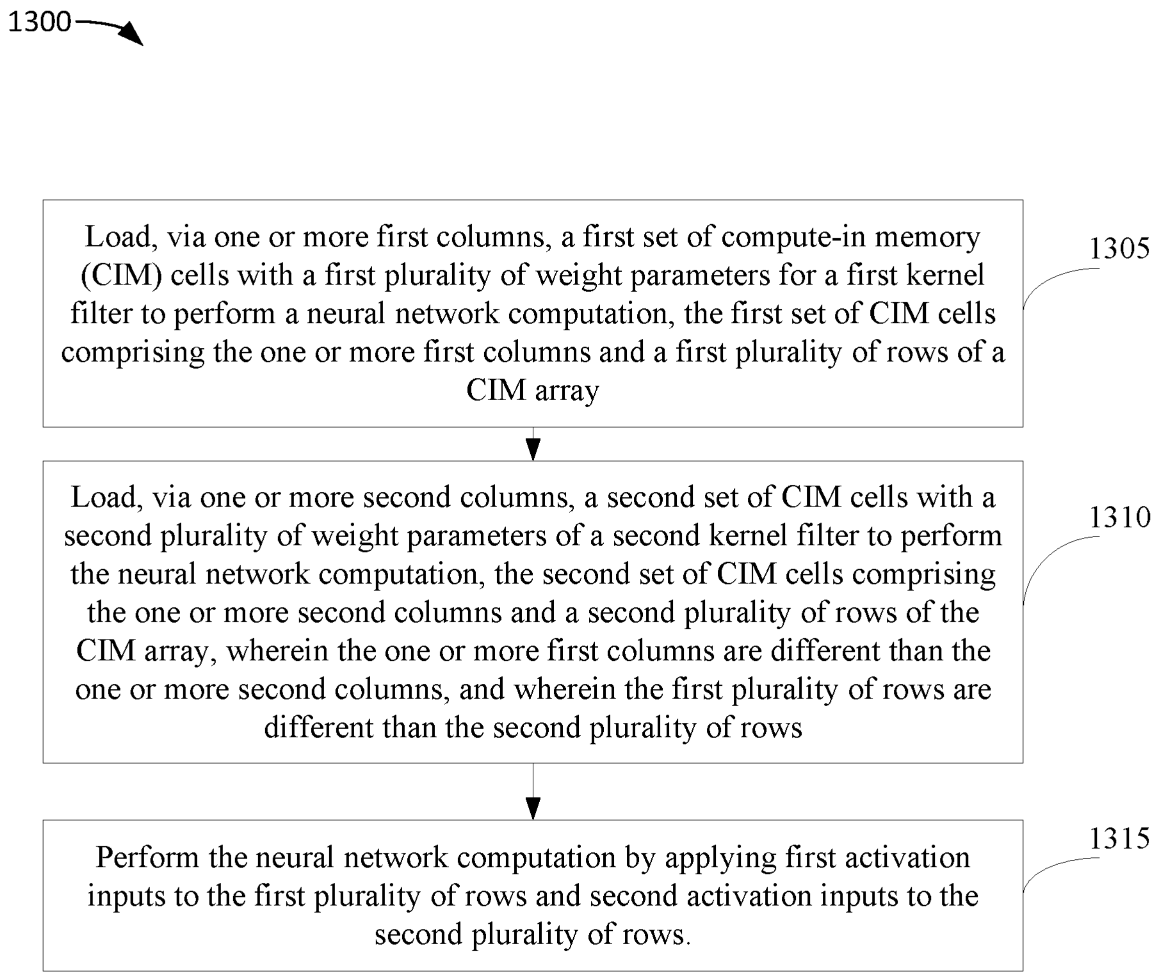

*FIG. 13*

COMPUTATION IN MEMORY (CIM) ARCHITECTURE AND DATAFLOW SUPPORTING A DEPTH-WISE CONVOLUTIONAL NEURAL NETWORK (CNN)

Aspects of the present disclosure relate to performing machine learning tasks and in particular to computation in memory architectures and dataflows.

Machine learning is generally the process of producing a trained model (e.g., an artificial neural network, a tree, or other structures), which represents a generalized fit to a set of training data that is known a priori. Applying the trained model to new data produces inferences, which may be used to gain insights into the new data. In some cases, applying the model to the new data is described as "running an inference" on the new data.

As the use of machine learning has proliferated for enabling various machine learning (or artificial intelligence) tasks, the need for more efficient processing of machine learning model data has arisen. In some cases, dedicated hardware, such as machine learning accelerators, may be used to enhance a processing system's capacity to process machine learning model data. However, such hardware requires space and power, which is not always available on the processing device. For example, "edge processing" devices, such as mobile devices, always on devices, internet of things (IoT) devices, and the like, have to balance processing capabilities with power and packaging constraints. Further, accelerators may need to move data across common data busses, which can cause significant power usage and introduce latency into other processes sharing the data bus. Consequently, other aspects of a processing system are being considered for processing machine learning model data.

Memory devices are one example of another aspect of a processing system that may be leveraged for performing processing of machine learning model data through so-called computation in memory (CIM) processes. Unfortunately, conventional CIM processes may not be able to perform processing of complex model architectures, such as depthwise separable convolutional neural networks, without additional hardware elements, such as digital multiply-and-accumulate circuits (DMACs) and related peripherals. These additional hardware elements use additional space, power, and complexity in their implementation, which tend to reduce the advantages of leveraging the memory device as an additional compute resource. Even where ancillary aspects of a processing system have DMACs available to perform processing that cannot be directly performed in memory, moving the data to and from those ancillary aspects requires time and power and therefore mitigate the benefits of the CIM process.

Accordingly, systems and methods are needed for performing computation in memory of a wider variety of machine learning model architectures, such as depthwise separable convolutional neural networks.

BRIEF SUMMARY

Certain aspects provide an apparatus for signal processing in a neural network. The apparatus generally includes a first set of computation in memory (CIM) cells configured as a first kernel for a neural network computation, the first set of CIM cells comprising on one or more first columns and a first plurality of rows of a CIM array, and a second set of CIM cells configured as a second kernel for the neural network computation, the second set of CIM cells comprising on one or more second columns and a second plurality of rows of the CIM array. In some aspects, the one or more first columns are different than the one or more second columns, and the first plurality of rows are different than the second plurality of rows.

Certain aspects provide a method for signal processing in neural network. The method generally includes loading, via one or more first columns, a first set of CIM cells with a first plurality of weight parameters for a first kernel to perform a neural network computation, the first set of CIM cells comprising the one or more first columns and a first plurality of rows of a CIM array. The method may also include loading, via one or more second columns, a second set of CIM cells with a second plurality of weight parameters of a second kernel to perform the neural network computation, the second set of CIM cells comprising the one or more second columns and a second plurality of rows of the CIM array. The one or more first columns may be different than the one or more second columns, and the first plurality of rows may be different than the second plurality of rows. The method may also include performing the neural network computation by applying first activation inputs to the first plurality of rows and second activation inputs to the second plurality of rows.

Certain aspects provide a non-transistor computer-readable medium comprising instructions that, when executed by one or more processors of a processing system, cause the processing system to perform a method of signal processing in neural network. The method generally includes loading, via one or more first columns, a first set of CIM cells with a first plurality of weight parameters for a first kernel to perform a neural network computation, the first set of CIM cells comprising the one or more first columns and a first plurality of rows of a CIM array. The method may also include loading, via one or more second columns, a second set of CIM cells with a second plurality of weight parameters of a second kernel to perform the neural network computation, the second set of CIM cells comprising the one or more second columns and a second plurality of rows of the CIM array. The one or more first columns may be different than the one or more second columns, and the first plurality of rows may be different than the second plurality of rows. The method may also include performing the neural network computation by applying first activation inputs to the first plurality of rows and second activation inputs to the second plurality of rows.

Other aspects provide processing systems configured to perform the aforementioned methods as well as those described herein; non-transistor, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain aspects of the one or more aspects and are therefore not to be considered limiting of the scope of this disclosure.

FIG. 13 is a flow diagram illustrating example operations for signal processing in a neural network, in accordance with certain aspects of the present disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1A:
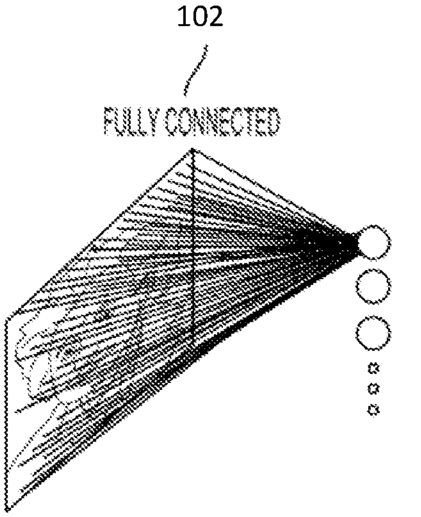
FIGS. 1A-1D depict examples of various types of neural networks.

Aspects of the present disclosure provide apparatuses, methods, processing systems, and computer readable mediums for performing computation in memory (CIM) of machine learning models, including depthwise separable convolutional neural networks. Certain aspects are directed to CIM cells of a CIM array configured for different kernels, where the CIM cells are implemented on different rows and columns of the CIM array, facilitating parallel operation of the first and second kernels. For example, a first kernel may be implemented on first rows and columns of the CIM array, and a second kernel may be implemented on a second rows and columns of the CIM array, where the first rows and columns are different than the second rows and columns. Each of the kernels implemented on different rows and columns may be coupled to an analog-to-digital converter (ADC), allowing parallel depth-wise (DW) computations and analog-to-digital conversions via the kernels. The results of the DW computations may be input to a nonlinear activation circuit for further processing and input to another CIM array for point-wise computations, as described in more detail herein.

CIM-based machine learning (ML)/artificial intelligence (AI) task accelerators may be used for a wide variety of tasks, including image and audio processing. Further, CIM may be based on various types of memory architecture, such as DRAM, SRAM (e.g., based on an SRAM cell as in FIG. 5), MRAM, and ReRAM, and may be attached to various types of processing units, including central processor units (CPUs), digital signal processors (DSPs), graphical processor units (GPUs), field-programmable gate arrays (FPGAs), AI accelerators, and others. Generally, CIM may beneficially reduce the "memory wall" problem, which is where the movement of data in and out of memory consumes more power than the computation of the data. Thus, by performing the computation in memory, significant power savings may be realized. This is particularly useful for various types of electronic devices, such as lower power edge processing devices, mobile devices, and the like.

For example, a mobile device may include a memory device configured for storing data and compute-in-memory operations. The mobile device may be configured to perform an ML/AI operation based on data generated by the mobile device, such as image data generated by a camera sensor of the mobile device. A memory controller unit (MCU) of the mobile device may thus load weights from another on-board memory (e.g., flash or RAM) into a CIM array of the memory device and allocate input feature buffers and output (e.g., activation) buffers. The processing device may then commence processing of the image data by loading, for example, a layer in the input buffer and processing the layer with weights loaded into the CIM array. This processing may be repeated for each layer of the image data and the output (e.g., activations) may be stored in the output buffers and then used by the mobile device for an ML/AI task, such as facial recognition.

Brief Background on Neural Networks, Deep Neural Networks, and Deep Learning Neural networks are organized into layers of interconnected nodes. Generally, a node (or neuron) is where computation happens. For example, a node may combine input data with a set of weights (or coefficients) that either amplifies or dampens the input data. The amplification or dampening of the input signals may thus be considered an assignment of relative significances to various inputs with regard to a task the network is trying to learn. Generally, input-weight products are summed (or accumulated) and then the sum is passed through a node's activation function to determine whether and to what extent that signal should progress further through the network.

In a most basic implementation, a neural network may have an input layer, a hidden layer, and an output layer. "Deep" neural networks generally have more than one hidden layer.

Deep learning is a method of training deep neural networks. Generally, deep learning maps inputs to the network to outputs from the network and is thus sometimes referred to as a "universal approximator" because it can learn to approximate an unknown function $f(x)=y$ between any input x and any output y. In other words, deep learning finds the right f to transform x into y.

More particularly, deep learning trains each layer of nodes based on a distinct set of features, which is the output from the previous layer. Thus, with each successive layer of a deep neural network, features become more complex. Deep learning is thus powerful because it can progressively extract higher level features from input data and perform complex tasks, such as object recognition, by learning to represent inputs at successively higher levels of abstraction in each layer, thereby building up a useful feature representation of the input data.

For example, if presented with visual data, a first layer of a deep neural network may learn to recognize relatively simple features, such as edges, in the input data. In another example, if presented with auditory data, the first layer of a deep neural network may learn to recognize spectral power in specific frequencies in the input data. The second layer of the deep neural network may then learn to recognize combinations of features, such as simple shapes for visual data or combinations of sounds for auditory data, based on the output of the first layer. Higher layers may then learn to recognize complex shapes in visual data or words in auditory data. Still higher layers may learn to recognize common visual objects or spoken phrases. Thus, deep learning architectures may perform especially well when applied to problems that have a natural hierarchical structure.

Layer Connectivity in Neural Networks

Neural networks, such as deep neural networks, may be designed with a variety of connectivity patterns between layers.

FIG. 1A illustrates an example of a fully connected neural network 102. In a fully connected neural network 102, a node in a first layer communicate its output to every node in a second layer, so that each node in the second layer will receive input from every node in the first layer.

Figure 1B:
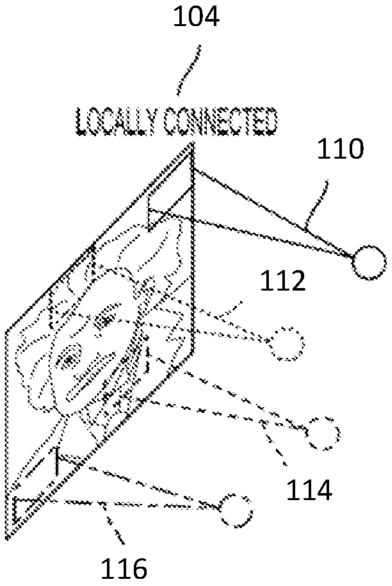

FIG. 1B illustrates an example of a locally connected neural network 104. In a locally connected neural network 104, a node in a first layer may be connected to a limited number of nodes in the second layer. More generally, a locally connected layer of the locally connected neural network 104 may be configured so that each node in a layer will have the same or a similar connectivity pattern, but with connections strengths (or weights) that may have different values (e.g., 110, 112, 114, and 116). The locally connected connectivity pattern may give rise to spatially distinct receptive fields in a higher layer, because the higher layer nodes in a given region may receive inputs that are tuned through training to the properties of a restricted portion of the total input to the network.

Figure 1C:
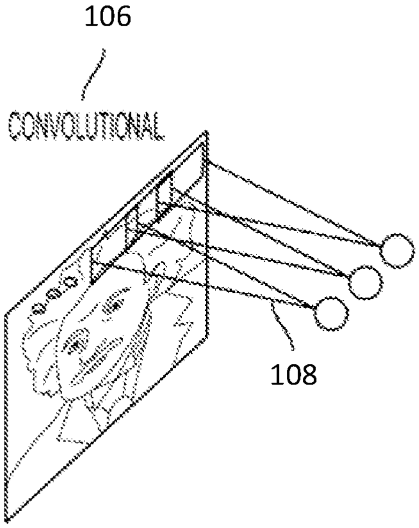

One type of locally connected neural network is a convolutional neural network. FIG. 1C illustrates an example of a convolutional neural network 106. Convolutional neural network 106 may be configured such that the connection strengths associated with the inputs for each node in the second layer are shared (e.g., 108). Convolutional neural networks are well-suited to problems in which the spatial location of inputs is meaningful.

One type of convolutional neural network is a deep convolutional network (DCN). Deep convolutional networks are networks of multiple convolutional layers, which may further be configured with, for example, pooling and normalization layers.

Figure 1D:
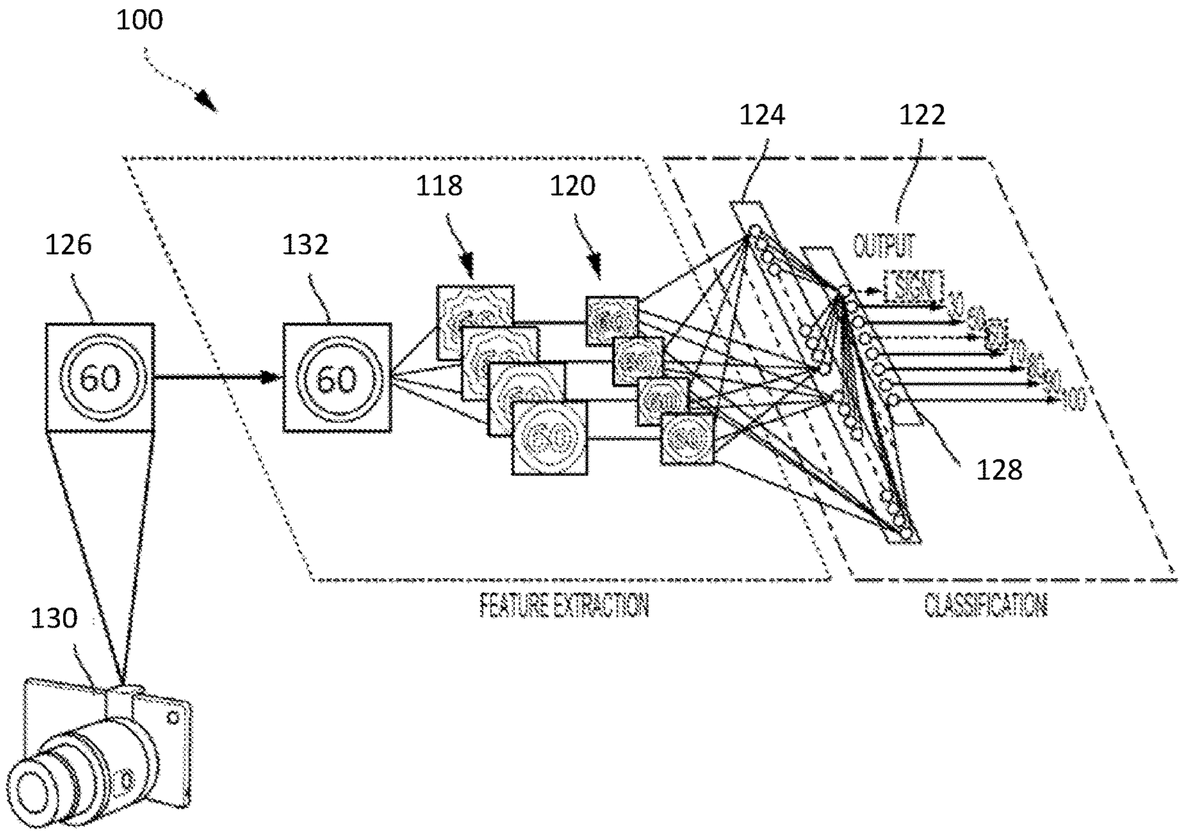

FIG. 1D illustrates an example of a DCN 100 designed to recognize visual features in an image 126 generated by an image capturing device 130. For example, if the image capturing device 130 was a camera mounted in a vehicle, then DCN 100 may be trained with various supervised learning techniques to identify a traffic sign and even a number on the traffic sign. DCN 100 may likewise be trained for other tasks, such as identifying lane markings or identifying traffic lights. These are just some example tasks, and many others are possible.

In this example, DCN 100 includes a feature extraction section and a classification section. Upon receiving the image 126, a convolutional layer 132 applies convolutional kernels (for example, as depicted and described in FIG. 2) to the image 126 to generate a first set of feature maps (or intermediate activations) 118. Generally, a "kernel" or "filter" comprises a multidimensional array of weights designed to emphasize different aspects of an input data channel. In various examples, "kernel" and "filter" may be used interchangeably to refer to sets of weights applied in a convolutional neural network.

The first set of feature maps 118 may then be subsampled by a pooling layer (e.g., a max pooling layer, not shown) to generate a second set of feature maps 120. The pooling layer may reduce the size of the first set of feature maps 118 while maintain much of the information in order to improve model performance. For example, the second set of feature maps 120 may be down-sampled to 14×14 from 28×28 by the pooling layer.

This process may be repeated through many layers. In other words, the second set of feature maps 120 may be further convolved via one or more subsequent convolutional layers (not shown) to generate one or more subsequent sets of feature maps (not shown).

In the example of FIG. 1D, the second set of feature maps 120 is provided to a fully-connected layer 124, which in turn generates an output feature vector 128. Each feature of the output feature vector 128 may include a number that corresponds to a possible feature of the image 126, such as "sign," "60," and "100." In some cases, a softmax function (not shown) may convert the numbers in the output feature vector 128 to a probability. In such cases, an output 122 of the DCN 100 is a probability of the image 126 including one or more features.

A softmax function (not shown) may convert the individual elements of the output feature vector 128 into a probability in order that an output 122 of DCN 100 is one or more probabilities of the image 126 including one or more features, such as a sign with the numbers "60" on it, as in input image 126. Thus, in the present example, the probabilities in the output 122 for "sign" and "60" should be higher than the probabilities of the others of the output 122, such as "30," "40," "50," "70," "80," "90," and "100".

Before training DCN 100, the output 122 produced by DCN 100 may be incorrect. Thus, an error may be calculated between the output 122 and a target output known a priori. For example, here the target output is an indication that the image 126 includes a "sign" and the number "60". Utilizing the known, target output, the weights of DCN 100 may then be adjusted through training so that subsequent output 122 of DCN 100 achieves the target output.

To adjust the weights of DCN 100, a learning algorithm may compute a gradient vector for the weights. The gradient may indicate an amount that an error would increase or decrease if a weight were adjusted in a particular way. The weights may then be adjusted to reduce the error. This manner of adjusting the weights may be referred to as "back propagation" as it involves a "backward pass" through the layers of DCN 100.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level.

After training, DCN 100 may be presented with new images and DCN 100 may generate inferences, such as classifications, or probabilities of various features being in the new image.

Convolution Techniques for Convolutional Neural Networks

Convolution is generally used to extract useful features from an input data set. For example, in convolutional neural networks, such as described above, convolution enables the extraction of different features using kernels and/or filters whose weights are automatically learned during training. The extracted features are then combined to make inferences.

An activation function may be applied before and/or after each layer of a convolutional neural network. Activation functions are generally mathematical functions (e.g., equations) that determine the output of a node of a neural network. Thus, the activation function determines whether it a node should pass information or not, based on whether the node's input is relevant to the model's prediction. In one example, where y=conv(x) (i.e., y=a convolution of x), both x and y may be generally considered as "activations". However, in terms of a particular convolution operation, x may also be referred to as "pre-activations" or "input activations" as it exists before the particular convolution and y may be referred to as output activations or a feature map.

Figure 2:
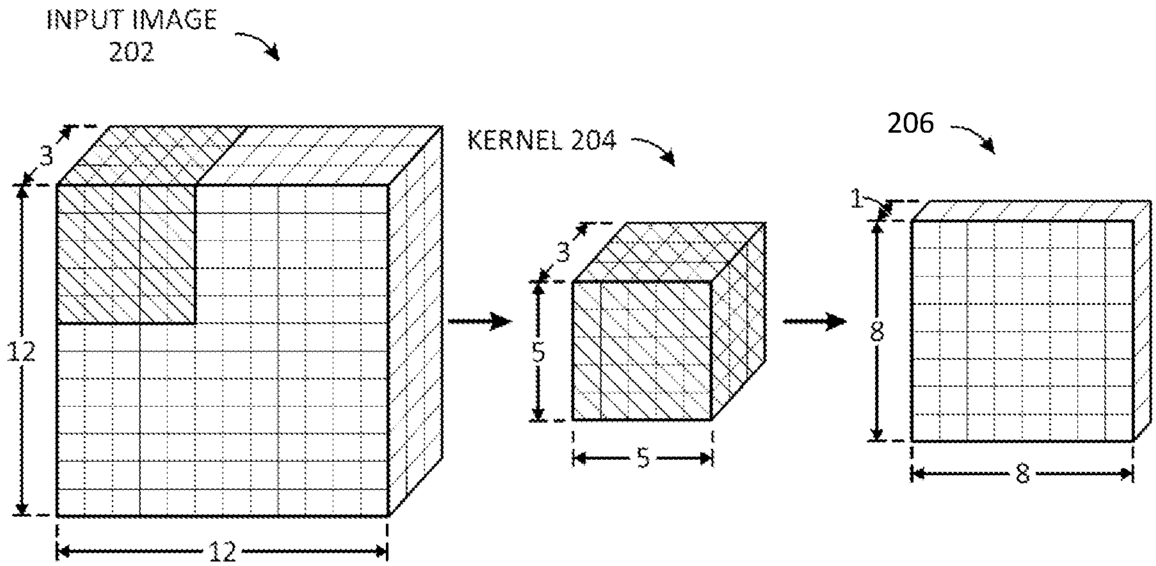
FIG. 2 depicts an example of a conventional convolution operation.

FIG. 2 depicts an example of a traditional convolution in which a 12 pixel×12 pixel×3 channel input image is convolved using a 5×5×3 convolution kernel 204 and a stride (or step size) of 1. The resulting feature map 206 is 8 pixels×8 pixels×1 channel. As seen in this example, the traditional convolution may change the dimensionality of the input data as compared to the output data (here, from 12×12 to 8×8 pixels), including the channel dimensionality (here, from 3 to 1 channel).

Figure 3A:
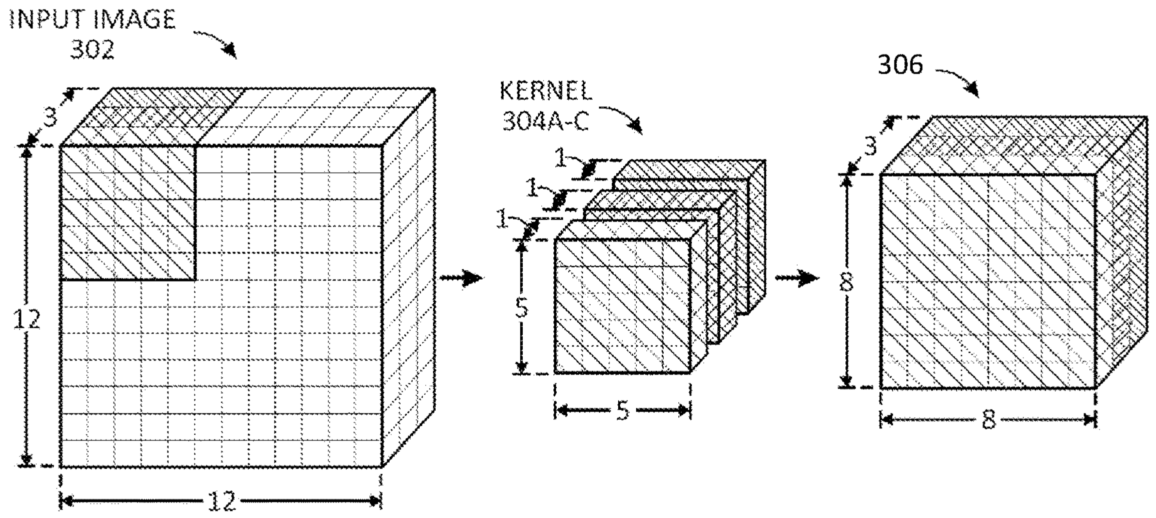
FIGS. 3A and 3B depicts examples of depthwise separable convolution operations.
Figure 3B:
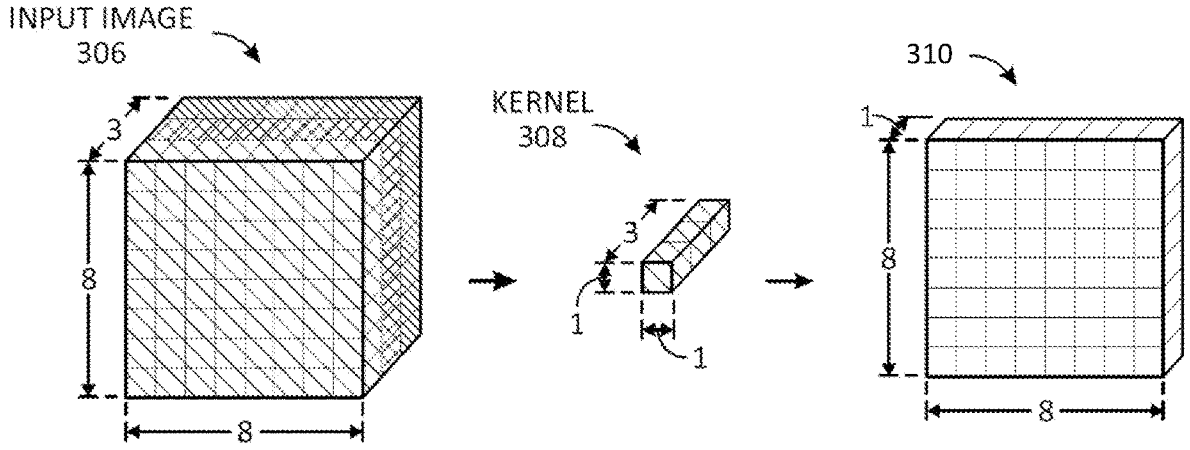

One way to reduce the computational burden (e.g., measured in floating point operations per second (FLOPs)) and the number parameters associated with a neural network comprising convolutional layers is to factorize the convolutional layers. For example, a spatial separable convolution, such as depicted in FIG. 2, may be factorized into two components: (1) a depthwise convolution, wherein each spatial channel is convolved independently by a depthwise convolution (e.g., a spatial fusion); and (2) a pointwise convolution, wherein all the spatial channels are linearly combined (e.g., a channel fusion). An examples of a depthwise separable convolution is depicted in FIGS. 3A and 3B. Generally, during spatial fusion, a network learns features from the spatial planes and during channel fusion the network learns relations between these features across channels.

In one example, a separable depthwise convolutions may be implemented using 3×3 kernels for spatial fusion, and 1×1 kernels for channel fusion. In particular, the channel fusion may use a 1×1×d kernel that iterates through every single point in an input image of depth d, wherein the depth d of the kernel generally matches the number of channels of the input image. Channel fusion via pointwise convolution is useful for dimensionality reduction for efficient computations. Applying 1×1×d kernels and adding an activation layer after the kernel may give a network added depth, which may increase its performance.

FIGS. 3A and 3B depicts an example of a depthwise separable convolution operation.

In particular, in FIG. 3A, the 12 pixel×12 pixel×3 channel input image 302 is convolved with a filter comprising three separate kernels 304A-C, each having a 5×5×1 dimensionality, to generate a feature map 306 of 8 pixels×8 pixels×3 channels, where each channel is generated by an individual kernel amongst 304A-C.

Then feature map 306 is further convolved using a pointwise convolution operation in which a kernel 308 (e.g., kernel) having dimensionality 1×1 ×3 to generate a feature map 310 of 8 pixels×8 pixels×1 channel. As is depicted in this example, feature map 310 has reduced dimensionality (1 channel versus 3), which allows for more efficient computations with feature map 310.

Though the result of the depthwise separable convolution in FIGS. 3A and 3B is substantially similar to the conventional convolution in FIG. 2, the number of computations is significantly reduced, and thus depthwise separable convolution offers a significant efficiency gain where a network design allows it.

Though not depicted in FIG. 3B, multiple (e.g., m) pointwise convolution kernels 308 (e.g., individual components of a filter) can be used to increase the channel dimensionality of the convolution output. So, for example, m=256 1×1×3 kernels 308 can be generated, which each output an 8 pixels×8 pixels×1 channel feature map (e.g., 310), and these feature maps can be stacked to get a resulting feature map of 8 pixels×8 pixels×256 channels. The resulting increase in channel dimensionality provides more parameters for training, which may improve a convolutional neural network's ability to identify features (e.g., in input image 302).

Example Compute in Memory (CIM) Architecture

Figure 4:
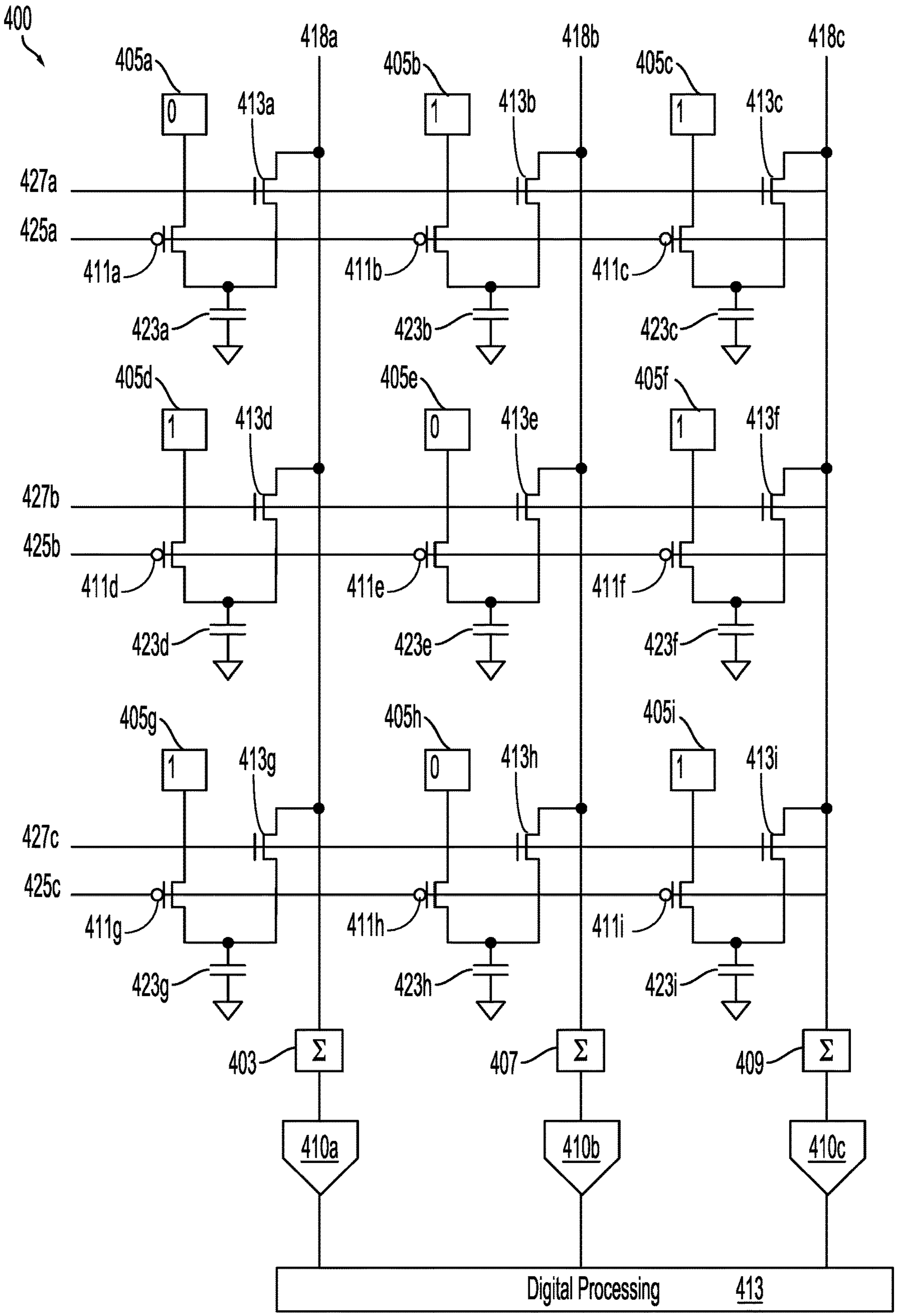
FIG. 4 illustrates an example computation in memory (CIM) array configured for performing machine learning model computations.

FIG. 4 illustrates an exemplary compute-in-memory (CIM) array 400 configured for performing machine learning model computations, according to aspects of the present disclosure. In this example, CIM array 400 is configured to simulate MAC operations using mixed analog/digital operations for an artificial neural network. Accordingly, as used herein, the terms multiplication and addition may refer to such simulated operations. CIM array 400 can be used to implement aspects of the processing techniques described herein.

In the depicted aspect, CIM array 400 includes precharge word lines (PCWLs) 425*a*, 425*b* and 425*c* (collectively 425), read word lines (RWLs) 427*a*, 427*b*, and 427*c* (collectively 427), analog-to-digital converters (ADCs) 410*a*, 410*b* and 410*c*, (collectively 410), a digital processing unit 413, bitlines 418*a*, 418*b*, and 418*c* (collectively 418), PMOS transistors 411*a*-111*i* (collectively 411), NMOS transistors 413*a*-413*i* (collectively 413), and capacitors 423*a*-423*i* (collectively 423).

Weights associated with a neural network layer may be stored in SRAM cells of CIM array 400. In this example, binary weights are shown in the SRAM bitcells 405*a*-405*i* of CIM array 400. Input activations (e.g., input values that may be an input vector) are provided on the PCWLs 425*a*-*c*.

Multiplication occurs in each bitcell 405*a*-405*i* of CIM array 400 associated with a bitline and the accumulation (summation) of all the bitcell multiplication results occurs on the same bitline for one column. The multiplication in each bitcell 405*a*-405*i* is in the form of an operation equivalent to an AND operation of the corresponding activation and weight, where the result is stored as a charge on the corresponding capacitor 423. For example, a product of 1, and consequently a charge on the capacitor 423, is produced only where the activation is one (here, because a PMOS is used, the PCWL is zero for an activation of one) and the weight is one.

For example, in an accumulating stage, RWLs 427 are switched to high so that any charges on capacitors 423 (which is based on corresponding bitcell (weight) and PCWL (activation) values) can be accumulated on corresponding bitlines 418. The voltage values of the accumulated charges are then converted by ADCs 410 to digital values (where, for example, the output values may be a binary value indicating whether the total charge is greater than a reference voltage). These digital values (outputs) may be provided as input to another aspect of a machine learning model, such as a following layer.

When activations on precharge word lines (PCWLs) 425*a*, 425*b* and 425*c* are, for example, 1, 0, 1, then the sums of bitlines 418*a-c* correspond to 0+0+1=1, 1+0+0=1, and 1+0+1=2, respectively. The output of the ADCs 410*a*, 410*b* and 410*c* are passed on to the digital processing unit 413 for further processing. For example, if CIM 100 is processing multi-bit weight values, the digital outputs of ADCs 110 may be summed to generate a final output.

The exemplary 3×3 CIM circuit 400 may be used, for example, for performing efficient 3-channel convolution for three-element kernels (or filters), where the weights of each kernel correspond to the elements of each of the three columns, so that for a given three-element receptive field (or input data patch), the outputs for each of the three channels are calculated in parallel.

Notably, while FIG. 4 describes an example of CIM using SRAM cells, other memory types can be used. For example, dynamic random access memory (DRAM), magnetoresistive random-access memory (MRAM), and resistive random-access memory (ReRAM or RRAM) can likewise be used in other embodiments.

Figure 5A:
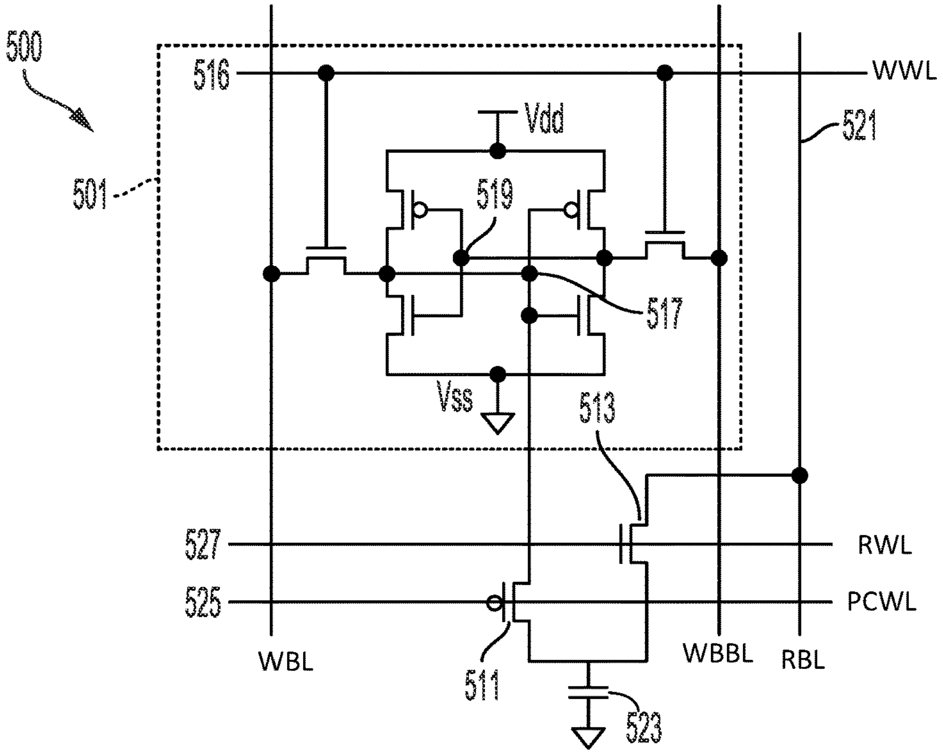
FIGS. 5A-5B depict additional details of an exemplary bit cell, which may be representative of the bitccells in FIG. 4.

FIG. 5A depicts additional details of an exemplary bitcell 500.

Aspects of FIG. 5A may be exemplary of or otherwise relate to aspect of FIG. 4. In particular, bitline 521 is similar to the bitline 418*a*, a capacitor 523 is similar to the capacitor 423 of FIG. 4, a read word line 527 is similar to the read word line 427*a* of FIG. 4, and a pre-charge word line 525 is similar to the pre-charge word line 425*a* of FIG. 4, PMOS transistor 511 is similar to PMOS transistor 411*a* of FIG. 1, and NMOS transistor 513 is similar to NMOS transistor 413 of FIG. 1.

The bitcell 500 includes a static random access memory (SRAM) cell 501, which may be representative of SRAM bitcells 405*a* of FIG. 4, as well as transistor 511 (e.g., a PMOS transistor), and transistor 513 (e.g., an NMOS transistor) and capacitor 523 coupled to ground. Although a PMOS transistor is used for the transistor 511, other transistors (e.g., an NMOS transistor) can be used in place of the PMOS transistor, with corresponding adjustment (e.g., inversion) of their respective control signals. The same applies to the other transistors described herein. The additional transistors 511 and 513 are included to implement the compute-in-memory array, according to aspects of the present disclosure. In one aspect, the SRAM cell 501 is a conventional six transistor (6T) SRAM cell.

Programming of weights in the bitcell may be performed once for a multitude of activations. For example, in operation, the SRAM cell 501 receives only one bit of information at nodes 517 and 519 via a write word line (WWL) 516. For example, during write (when WWL 216 is high), if write bit line (WBL) 229 is high (e.g., "1"), then node 217 sets to high and node 219 sets to low (e.g., "0"); or if WBL 229 is low, then node 217 sets to low and node 219 sets to high. Conversely, during write (when WWL 216 is high), if write bit bar line (WBBL) 231 is high, then node 217 sets to low and node 219 sets to high; or if WBBL 229 is low, then node 217 sets to high and node 219 sets to low.

The programming of weights may be followed by an an activation input and multiplication step to charge the capacitors in accordance with the corresponding products. For example, the transistor 511 is activated by an activation signal (PCWL signal) through a pre-charge word line (PCWL) 525 of the compute-in-memory array to perform the multiplication step. Then the transistor 513 is activated by a signal through another word line (e.g., a read word line (RWL) 527) of the compute-in-memory array to preform the accumulation of the multiplication value from bitcell 500 with other bitcells of an array, such as described above with respect to FIG. 4.

If node 517 is a "0," (e.g., when the stored weight value is "0") the capacitor 523 will not be charged if a low PCWL indicates an activation of "1" at the gate of the transistor 511. Accordingly, no charge is provided to a bitline 521. However, if node 517, which corresponds to the weight value, is a "1", and PCWL is set to low (e.g., when the activation input is high), which turns on PMOS transistor 511, which acts as a short, allowing capacitor 523 to be charged. After the capacitor 523 is charged, the transistor 511 is turned off so the charge is stored in the capacitor 523. To move the charge from the capacitor 523 to the bitline 521, the NMOS transistor 513 is turned on by RWL 527 causing the the NMOS transistor 513 to act as a short.

Table 1 illustrates an example of compute-in-memory array operations according to an AND operational setting, such as may be implemented by bitcell 500 in FIG. 5A.

TABLE 1

| AND Operation | | | |
|---|---|---|---|
| Activation | PCWL | Cell Node (Weight) | Capacitor Node |
| 1 | 0 | 1 | 1 |
| 1 | 0 | 0 | 0 |
| 0 | 1 | 1 | 0 |
| 0 | 1 | 0 | 0 |

A first column (Activation) of Table 1 includes possible values of an incoming activation signal.

A second column (PCWL) of Table 1 includes PCWL values that activate transistors designed to implement compute-in-memory functions according to aspects of the present disclosure. Because the transistor 511 in this example is a PMOS transistor, the PCWL values are inverses of the activation values. For example, the compute-in-memory array includes the transistor 511 that is activated by an activation signal (PCWL signal) through the pre-charge word line (PCWL) 525.

A third column (Cell Node) of Table 1 includes weight values stored in the SRAM cell node, for example, corresponding to weights in a weight tensor, such as a may be used in convolution operations.

A fourth column (Capacitor Node) of Table 1 shows the resultant products that will be stored as charge on a capacitor. For example, the charge may be stored at a node of the capacitor 523 or a node of one of the capacitors 423*a*-423*i*. The charge from the capacitor 523 is moved to the bitline 521 when the transistor 513 is activated. For example, referring to the transistor 511, when the weight at the cell node 517 is a "1" (e.g., high voltage) and the input activation is a "1" (so PCWL is "0"), the capacitor 523 is charged (e.g., the node of the capacitor is a "1"). For all other combinations, the capacitor node will have a value of 0.

Figure 5B:
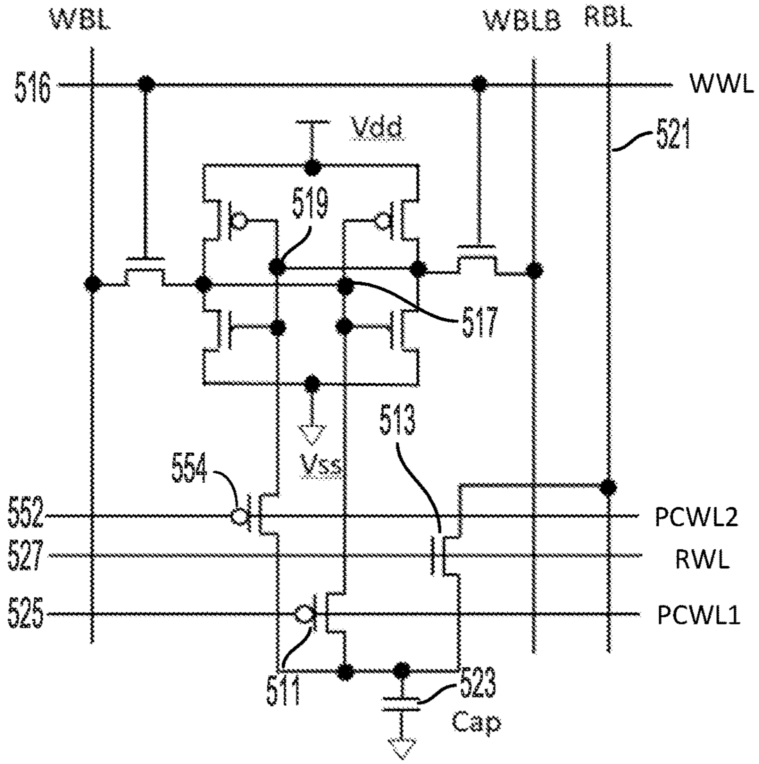

FIG. 5B depicts additional details of another exemplary bitcell 550.

Bitcell 550 differs from bitcell 500 in FIG. 5A primarily based on the inclusion of an additional pre-charge word line 552 coupled to an additional transistor 554.

Table 2 illustrates an example of compute-in-memory array operations similar to Table 1, except according to an XNOR operational setting, such as may be implemented by bitcell 550 in FIG. 5B.

TABLE 2

XNOR Operation

| Activation | PCWL1 | PCWL2 | Cell Node (Weight) | Capacitor Node |
|---|---|---|---|---|
| 1 | 0 | 1 | 1 | 1 |
| 1 | 0 | 1 | 0 | 0 |
| 0 | 1 | 0 | 1 | 0 |
| 0 | 1 | 0 | 0 | 1 |

A first column (Activation) of Table 2 includes possible values of an incoming activation signal.

A second column (PCWL1) of Table 2 includes PCWL1 values that activate transistors designed to implement compute-in-memory functions according to aspects of the present disclosure. Here again, the transistor 511 is a PMOS transistor, the PCWL1 values are inverses of the activation values.

A third column (PCWL2) of Table 2 includes PCWL2 values that activate further transistors designed to implement compute-in-memory functions according to aspects of the present disclosure.

A fourth column (Cell Node) of Table 2 includes weight values stored in the SRAM cell node, for example, corresponding to weights in a weight tensor, such as a may be used in convolution operations.

A fifth column (Capacitor Node) of Table 2 shows the resultant products that will be stored as charge on a capacitor, such as capacitor 523.

Figure 6:
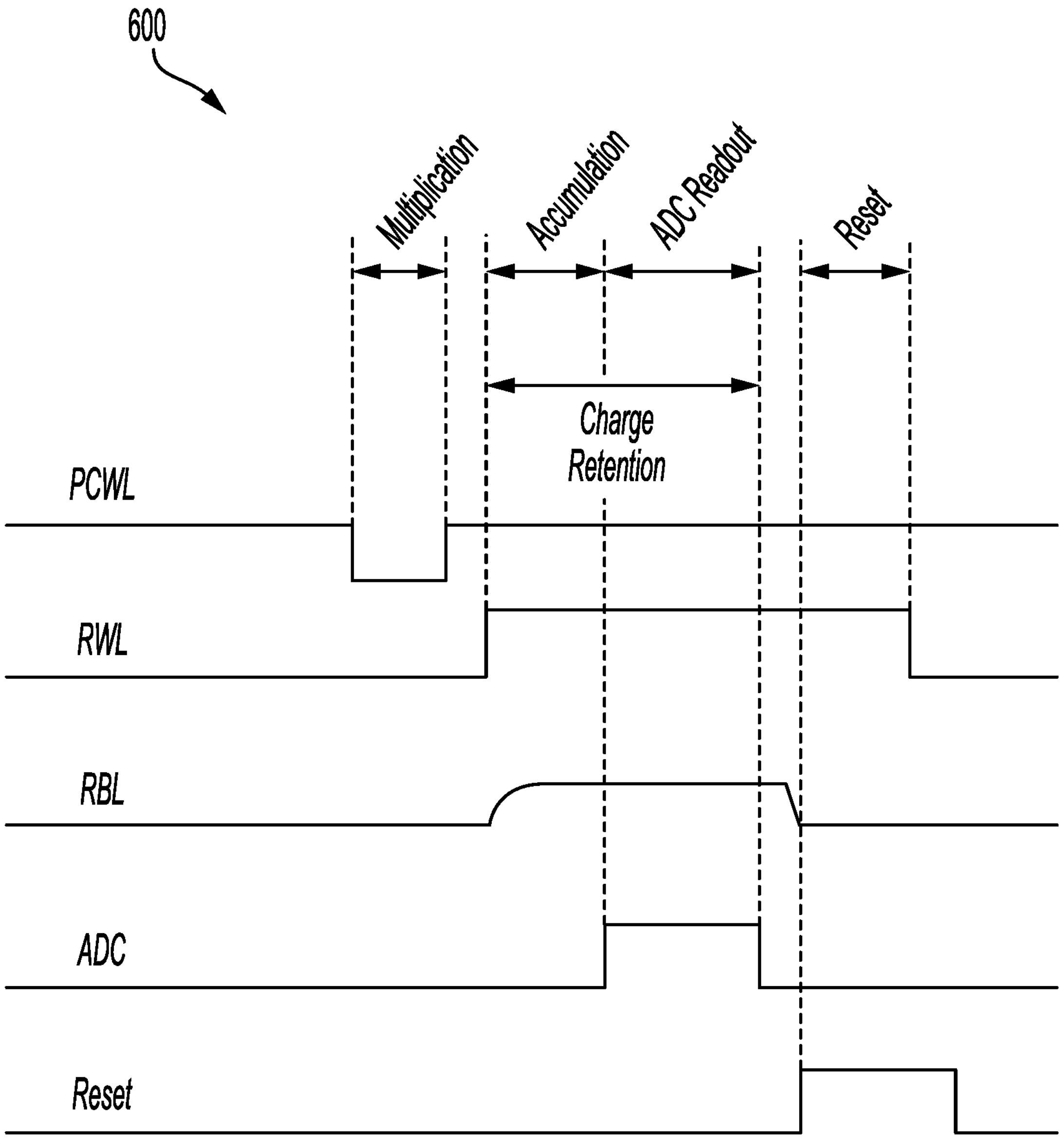
FIG. 6 depicts an example timing diagram of various signals during a compute-in-memory (CIM) array operation.

FIG. 6 depicts an example timing diagram 600 of various signals during a compute-in-memory (CIM) array operation.

In the depicted example, a first row of the timing diagram 600 shows a pre-charge word line PCWL (e.g., 425*a* of FIG. 4 or 525 of FIG. 5A), going low. In this example, a low PCWL indicates an activation of "1." The PMOS transistor turns on when PCWL is low, which allows charging of the capacitor (if the weight is "1"). A second row shows a read word line RWL (e.g., read word line 427*a* of FIG. 4 or 527 of FIG. 5A.) A third row shows a read bitline RBL (e.g. 418 of FIG. 4 or 521 of FIG. 5A), a fourth row shows an analog-to-digital converter (ADC) readout signal and a fifth row shows a reset signal.

For example, referring to the transistor 511 of FIG. 5A, a charge from the capacitor 523 is gradually passed on to the read bitline RBL when the read word line RWL is high.

A summed charge/current/voltage (e.g., 403 of FIG. 4 or charges summed from the the bitline 521 of FIG. 5A) is passed on to a comparator or ADC (e.g., the ADC 411 of FIG. 4) where the summed charge is converted to a digital output (e.g., digital signal/number). The summing of the charge may occur in an accumulation region of the timing diagram 600 and a readout from the ADC may be associated with the ADC readout region of the timing diagram 600. After the ADC readout is obtained, the reset signal discharges all of the capacitors (e.g., capacitors 423*a*-423*i*) in preparation for processing the next set of activation inputs.

The parallel processing techniques of the present disclosure can help with any type of edge computing involving artificial neural networking. The techniques have applicability at the inference stage or any other stage of neural network processing. While the depicted example is based on a binary network, which may be used when high accuracy is not needed, the same concepts apply to networks using multibit weights.

Example of Convolution Processing in Memory

Figure 7:
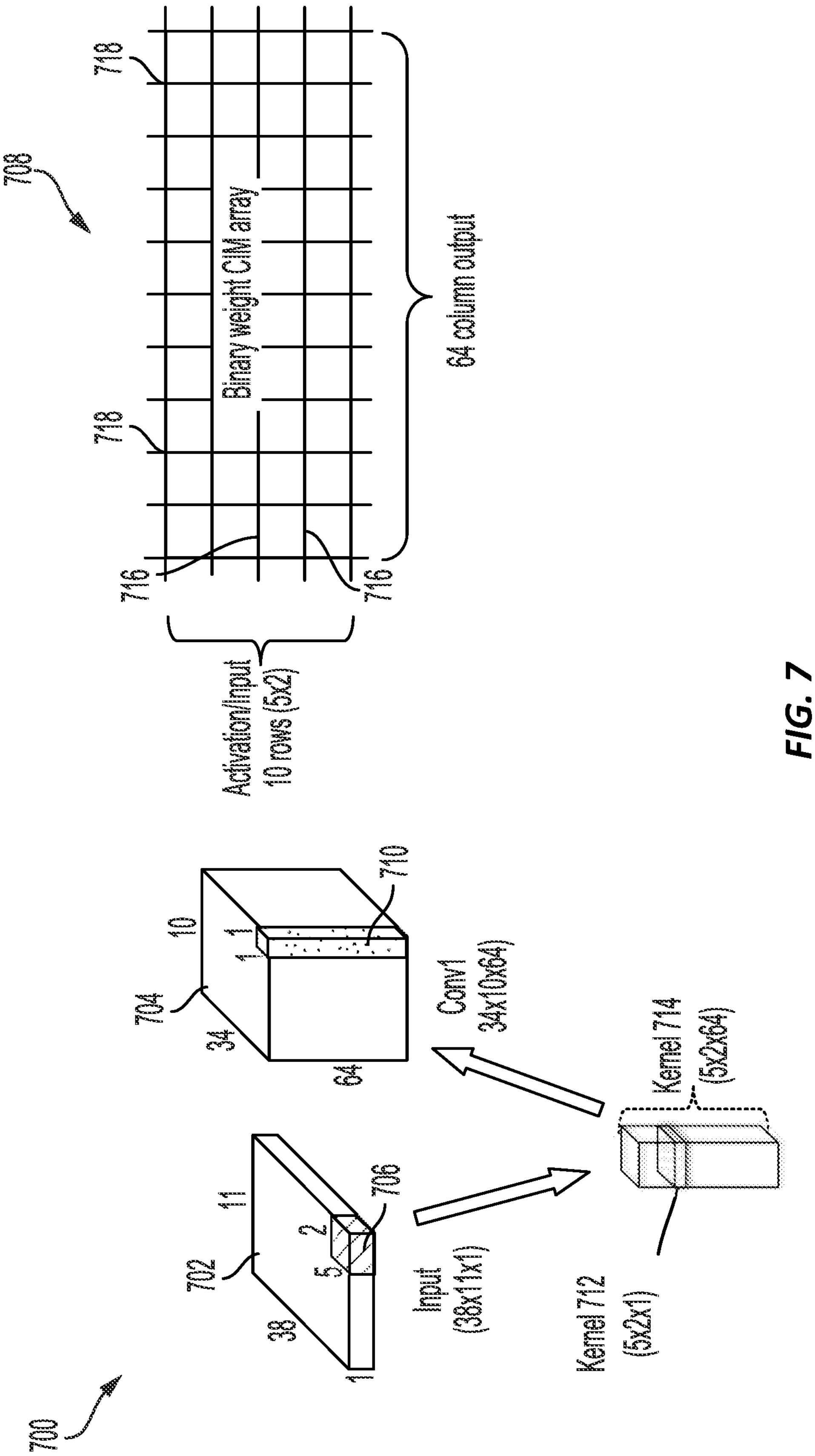
FIG. 7 depicts an exemplary convolutional layer architecture implemented by a compute-in-memory (CIM) array.

FIG. 7 depicts an exemplary convolutional layer architecture 700 implemented by a compute-in-memory (CIM) array 708. The convolutional layer architecture 700 may be a part of a convolutional neural network (e.g., as described above with respect to FIG. 1D) and designed to process multidemensional data, such as tensor data.

In the depicted example, input 702 to the convolutional layer architecture 700 has dimensions of 38 (height)×11 (width)×1 (depth). The output 704 of the convolutional layer has dimensions 34×10×64, which includes 64 output channels corresponding to the 64 kernels of filter tensor 714 applied as part of the convolution process. Further in this example, each kernel (e.g., exemplary kernel 712) of the 64 kernels of filter tensor 714 has dimensions of 5×2×1 (all together, the kernels of filter tensor 714 are equivalent to one 5×2×64 filter).

During the convolution process, each 5×2×1 kernel is convolved with the input 702 to generate one 34×10×1 layer of output 704. During the convolution, the 640 weights of filter tensor 714 (5×2×64) may be stored in the compute-in-memory (CIM) array 708, which in this example includes a column for each kernel (i.e., 64 columns). Then activations of each of the 5×2 receptive fields (e.g., receptive field input 706) are input to the CIM array 708 using the word lines, e.g., 716, and multiplied by the corresponding weights to produce a 1×1×64 output tensor (e.g., an output tensor 710). Output tensors 704 represent an accumulation of the 1×1×64 individual output tensors for all of the receptive fields (e.g., the receptive field input 706) of the input 702. For simplicity, the CIM array 708 of FIG. 7 only shows a few illustrative lines for the input and the output of the CIM array 708.

In the depicted example, CIM array 708 includes wordlines 716 through which the CIM array 708 receives the receptive fields (e.g., receptive field input 706), as well as bitlines 718 (corresponding to the columns of the CIM array 708). Though not depicted, CIM array 708 may also include precharge wordlines (PCWL) and read word lines RWL (as described above with respect to FIGS. 4 and 5).

In this example, wordlines 716 are used for initial weight definition. However, once the initial weight definition occurs, the activation input activates a specially designed line in a CIM bitcell to perform a MAC operation. Thus, each intersection of a bitline 718 and a wordline 716 represents a filter weight value, which is multiplied by the input activation on the wordline 716 to generate a product. The individual products along each bitline 718 are then summed to generate corresponding output values of the output tensor 710. The summed value may be charge, current, or voltage. In this example, the dimensions of the output tensor 704, after processing the entire input 702 of the convolutional layer, are 34×10×64, though only 64 filter outputs are generated at a time by the CIM array 708. Thus, the processing of the entire input 702 may be completed in 34×10 or 340 cycles.

CIM Architectures for Depthwise Separable Convolution

A computation in memory (CIM) based artificial intelligence (AI) hardware (HW) accelerator may be used for various tasks, including image, sensor, and audio processing AI tasks. CIM may help reduce issues associated with power consumption when moving data from memory. In some cases, data movement may consume more power than computation. Using a CIM may result in power savings due to the weight stationary nature of CIM. In other words, weights for neural network computations may be stored in, for example, random access memory (RAM), such as in static random access memory (SRAM) memory cells, allowing computations to be performed in memory resulting in reduced power consumption.

Vector-matrix multiplication blocks implemented in memory for CIM architectures can perform conventional convolutional neural network processing generally well, but they are not efficient for supporting depthwise separable convolutional neural networks, which are found in many state of the art machine learning architectures. For example, existing CIM architectures generally cannot perform depthwise separable convolutional neural networks processing in one phase because each multidimensional filter uses different input channels. Thus, the filter weights in the same row may not share the same activation input for different channels. Consequently, matrix-matrix multiplication (M×M) architectures are generally needed to support depthwise separable convolution processing in a one phase cycle.

Conventional solutions for addressing this shortcoming include adding a separate digital MAC block to handle processing for the depthwise portion of a separable convolution while a CIM array can handle the pointwise portion of the separable convolution. However, this hybrid approach results in increased data movement, which can offset the memory efficient advantage of the CIM architecture. Further, the hybrid approach generally involves additional hardware (e.g., the digital multiply-and-accumulate (DMAC) element), which increases space and power needs, and increases processing latency. Moreover, the use of DMACs may impact timing of processing operations and cause model output timing constraints (or other dependencies) to be overrun. In order to resolve that issue, various compromises may be necessary, such as reducing the frame rate of incoming data, increasing the clock rate of processing system elements (including a CIM array), reducing input feature size, and others.

The CIM architectures described herein improve timing performance of processing operations for depthwise separable convolutions. These improvements beneficially result in less cycle time for depthwise separable convolution operations and achieve higher total operations per second (TOPS) per watt of processing power, i.e., TOPS/W, compared to conventional architectures that use more hardware (e.g., DMACs) and/or more data movement.

Figure 8:
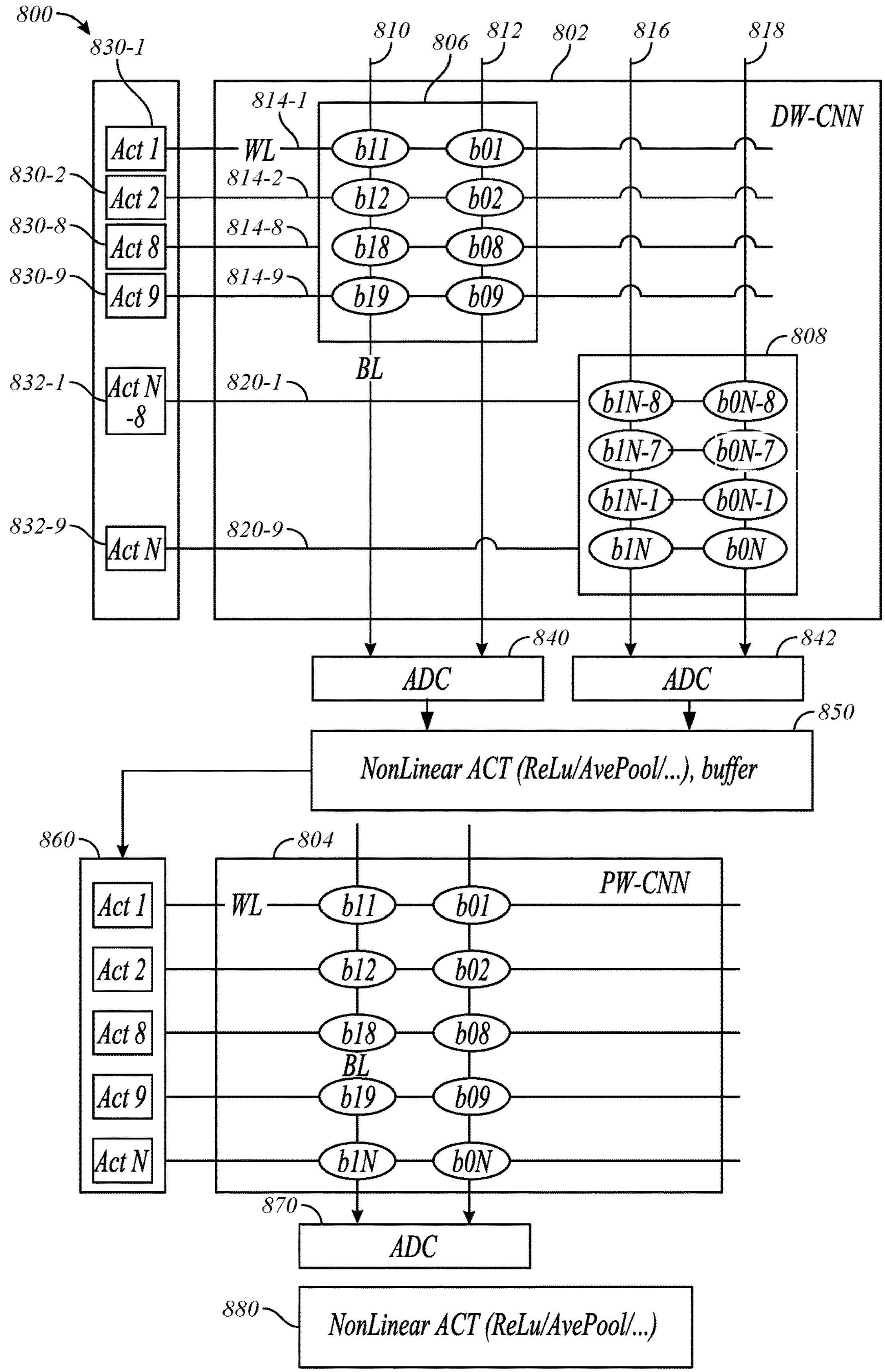
FIG. 8 illustrates a CIM architecture including multiple CIM arrays, in accordance with certain aspects of the present disclosure.

FIG. 8 illustrates a CIM system 800 including multiple CIM arrays, in accordance with certain aspects of the present disclosure.

As illustrated, the CIM system 800 includes a CIM array 802 configured for depthwise (DW) convolution and a CIM array 804 configured for pointwise (PW) convolution. In some aspects, kernels (e.g., 3×3 kernels) may be implemented on different columns of the CIM array 802 in a diagonal fashion. For example, a kernel 806 may be implemented using CIM cells on columns 810, 812 (e.g., bit-lines) and nine rows 814-1, 814-2 to 814-8, and 814-9 (e.g., word-lines (WLs), collectively referred to as rows 814) to implement a 3×3 filter with 2-bit weight parameters. Another kernel 808 may be implemented on columns 816, 818 and nine rows 820-1 to 820-9 (collectively referred to as rows 820) to implement another 3×3 filter. Thus, the kernels 806 and 808 are implemented on different rows and columns to facilitate parallel convolution operations for DW. That is, activating the rows and columns for one of the kernels 806, 808 does not impact the rows and columns of the other one of the kernels 806, 808. Different activation inputs may be provided to each of the kernels 806, 808, allowing the kernels 806, 808 to be operated in parallel.

Each kernel's input activation buffer may be filled (e.g., stored) with the corresponding output channel patches from previous layers. For example, the rows (e.g., rows 814) for the kernel 806 may be coupled to activation buffers 830-1, 830-2 to 830-8, and 830-9 (collectively referred to as activation buffers 830), and the rows (e.g., rows 820) for the kernel 808 may be coupled to activation buffers 832-1 to 832-9 (collectively referred to as activation buffer 832).

The outputs (e.g., at columns 810, 812) of the kernel 806 may be coupled to an analog to digital converter (ADC) 840, and the outputs (e.g., at columns 816, 818) of the kernel 808 may be coupled to an ADC 842. For example, each input of ADC 840 may receive an accumulated charge of rows 814 from each of columns 810, 812, and each input of ADC 842 may receive an accumulated charge of rows 820 from each of columns 816, 818, based on which each of ADCs 840, 842 generates a digital output signal. The ADC 840 takes as input the signals from columns 810, 812, and generates a digital representation of the signals, taking into account that bits stored in column 812 represent a lower significance in respective weights than the bits stored in column 810. Similarly, the ADC 842 takes as input the signals from columns 816, 818, and generates a digital representation of the signals, taking into account that bits stored in column 818 represent a lower significance in respective weights than the bits stored in column 816.

While ADCs 840, 842 are implemented to receive signals from two columns to facilitate analog to digital conversion for kernels with 2-bit weight parameters, the aspects described herein may be implemented for ADCs configured to receive signals from any number of columns (e.g., three columns to perform analog to digital conversion for kernels with 3-bit weight parameters).

The outputs of ADCs 840, 842 may be coupled to a nonlinear operation circuit 850 (and buffer) to implement a nonlinear operation, such as a rectified linear unit (ReLU) and average pooling (AvePool), to name a few. Nonlinear operations allow for the creation of complex mappings between inputs and outputs and thus allow for learning and modeling complex data, such as images, video, audio, and data sets which are nonlinear or have high dimensionality. The output of the nonlinear operation circuit 850 may be coupled to input activation buffers 860 for the CIM array 804 configured for PW convolution. The outputs of the CIM array 804 may be coupled to ADC 870 and the outputs of the ADC 870 may be provided to a nonlinear operation circuit 880, as illustrated. While a single ADC 870 is shown, multiple ADCs may be implemented for different columns of the CIM array 804.

While each of the kernels 806, 808 include two columns, allowing a 2-bit weight to be stored in each row of the kernel, the kernels 806, 808 may be implemented using any number of suitable columns, such as one column for a 1-bit, binary weight or two or more columns for multibit weights. For example, each of the kernels 806, 808 may be implemented using three columns to facilitate a three-bit weight parameter to be stored in each row of the kernel, or using a single column to facilitate a one-bit weight to be stored in each row of the kernel. Moreover, while each of kernels 806, 808 are implemented with nine rows for a 3×3 kernel to facilitate understanding, the kernels 806, 808 may be implemented with any number of rows to implement a suitable kernel size. Moreover, more than two kernels may be implemented using subset of cells of a CIM array. For example, the CIM array 802 may include one or more other kernels, where the kernels of the CIM array 802 are all implemented on different rows and columns to facilitate parallel convolution operations. For example, the kernel 806 may correspond to the kernel 304A described with respect to FIG. 3A, the kernel 808 may correspond to the kernel 304B described with respect to FIG. 3A. Another kernel (not shown in FIG. 8) corresponding to kernel 304C may also be implemented on different rows and columns than kernels 806, 808.

Figure 9:
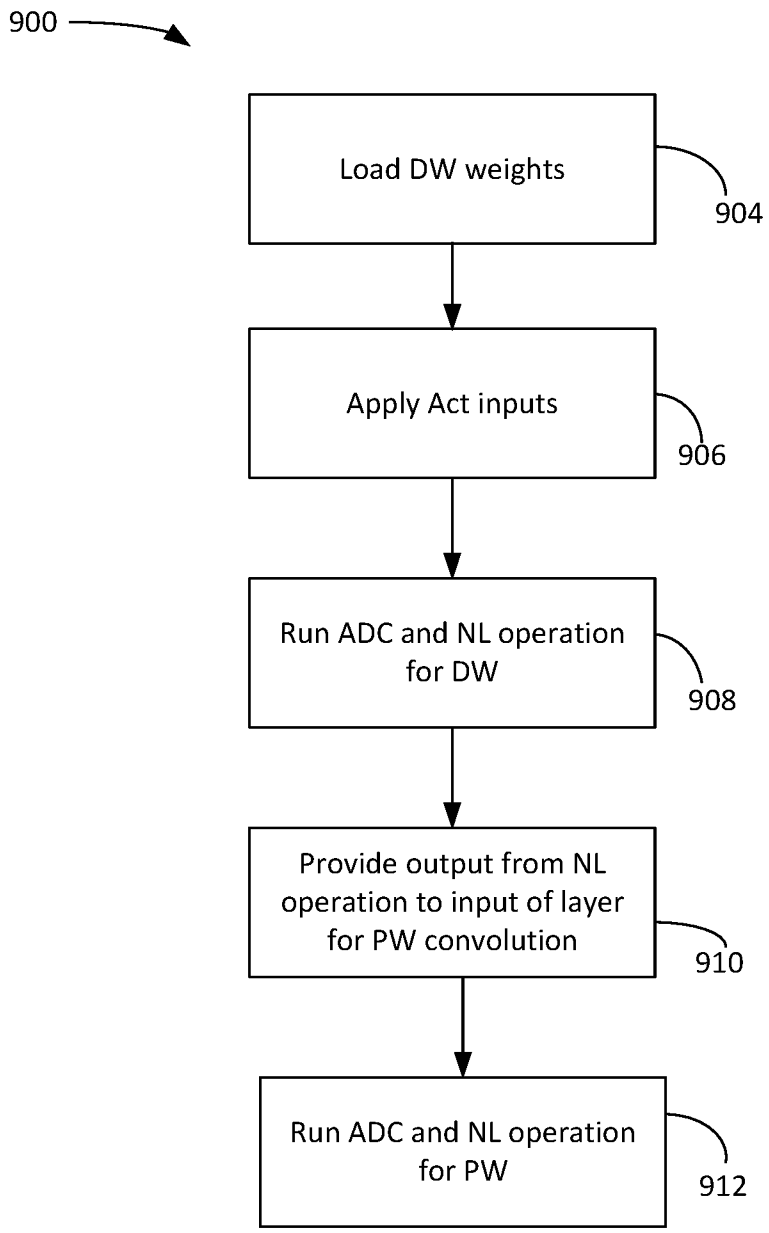
FIG. 9 illustrates example operations for signaling processing via a CIM architecture, in accordance with certain aspects of the present disclosure.

FIG. 9 illustrates example operations 900 for signal processing via the CIM system 800 of FIG. 8, in accordance with certain aspects of the present disclosure. The operations 900 may begin with processing of a DW-CNN layer. For example, at block 904, DW convolution weights may be loaded in the CIM cells of a CIM array (e.g., for kernels 806, 808), as described herein. For example, at block 904, DW 3×3 kernel weights may be grouped and written into the CIM array 802 of FIG. 8. That is, a 2-bit kernel weight may be provided to columns 810, 812, and pass gate switches of memory cells (e.g., memory cells b01 and b11 shown in FIG. 8) may be closed to store the 2-bit kernel weights in the memory cells. Filter weight may be stored in each row of CIM cells for each of kernel 806, 808 in a similar fashion.

The weights that may have been previously stored in memory cells on the same columns, but on different rows than the active kernel, may be zeroed out. For instance, a logic zero may be stored in memory cells (not shown) at columns 816, 818 and rows 820, as well as memory cells at columns 810, 812 and rows 814. In some cases, the CIM array 802 may be zeroed out first, before storing weights for kernels 806 and 808.

In some implementations, the CIM array may be partitioned into tiles. For example, the tiles on the same column as the active kernel may be configured in a tristate mode. In tristate mode, the output of memory cell of a tile may be configured to have a relatively high impedance, effectively removing the cell's influence on the output. As described herein, the DW convolution kernels in the different columns and rows may be stacked. Both DW convolution and PW convolution weights may be updated for each of the subsequent layers.

At block 906, the DW convolution activation input (e.g., at activation buffers 830, 832) may be applied for each group of rows of kernels 806, 808 during the same cycle to generate a DW convolution output in parallel using both kernels.

At block 908, the ADCs 840, 842 may convert the convolution output of the kernels 806, 808 (e.g. at columns 810, 812 and columns 816, 818) from the analog domain to the digital domain. A nonlinear operation may be performed via the nonlinear operation circuit 850 based on the outputs of the ADCs 840, 842 for the DW convolution.

At block 910, the output from the nonlinear operation circuit 850 may be applied to the PW input (e.g., stored in input activation buffers 860) for the CIM array 804 to perform a PW convolution. At block 912, the ADC 870 may convert the PW convolution output from CIM array 804 from the analog domain to the digital domain. A nonlinear operation may be performed via the nonlinear operation circuit 880 based on the outputs of the ADC 870 for the PW convolution.

By implementing kernels on different rows and columns, convolution operations may be performed in parallel, facilitating faster processing time and lower dynamic power as compared to conventional implementations. In other words, performing parallel convolution operations allows processing of multiple filters in one cycle, as opposed to processing each filter in a different cycle, saving processing time and lowering dynamic power. In some aspects, each kernel may be repeated multiple times to increase the row utilization and reduce the ADC range compression, as described in more detail herein.

Techniques Reducing Power Consumption and Increasing CIM Array Utilization

Figure 10:
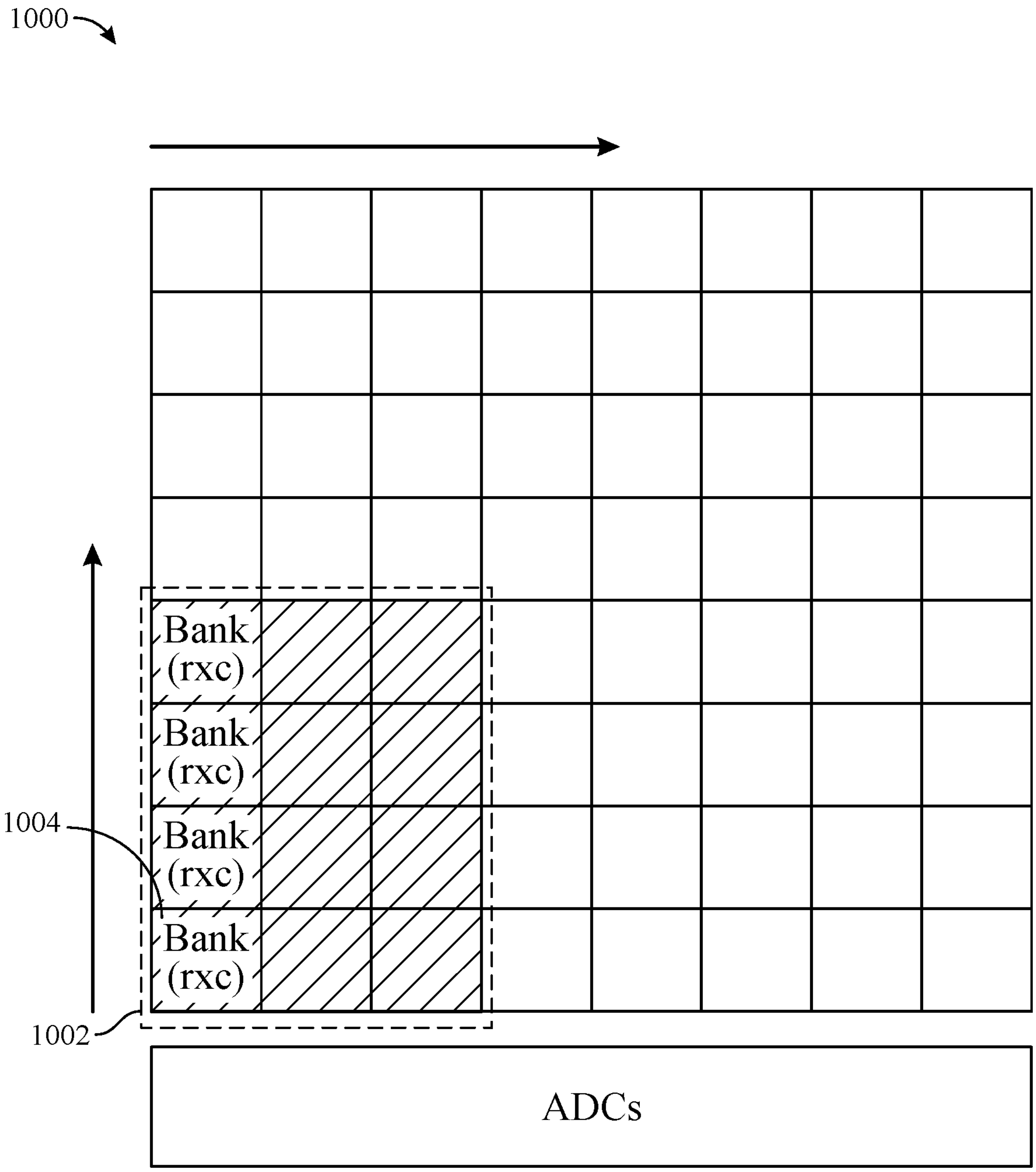
FIG. 10 illustrates a CIM array divided into sub-banks to save power, in accordance with certain aspects of the present disclosure.

FIG. 10 illustrates a CIM array 1000 divided into tiles (also referred to as sub-banks) to save power, in accordance with certain aspects of the present disclosure. The CIM array 1000 may have 1024 rows and 256 columns, as an example. Individual tiles (e.g. sub-banks) of rows and columns may be enabled or disabled. For instance, a tile may include 128 rows and 23 columns. As one example, the tile array 1002 (e.g., including multiple tiles, such as tile 1004) may be active for DW-CNN convolution, while the remaining tiles may be disabled. In other words, the remaining tiles may be configured in tristate mode.

In some implementations, row and column filler cells may be implemented in the CIM array 1000. The filler circuits (e.g., buffers or switches) may be used to enable or disable tiles of a CIM array to save power. A column filler cell may be AND gating logic, and a row filler cell may be a buffer on a write bit-line (WBL) and a transmission switch on a read bit-line (RBL). The size and type of the transmission switch may be configured based on linearity specifications.

DW convolution may use relatively small kernel dimensions (3×3, 5×5, . . . ) and the underutilization of the CIM array may affect output signal to noise ratio (SNR) due to range compression (e.g., the output of the neural network being distributed within a small range due to nonlinear activation). Certain aspects of the present disclosure are directed to techniques for improving the SNR. For example, a fine-grained tiling design may be used to mitigate the impact to SNR, as described in more detail herein with respect to FIG. 11.

Figure 11:
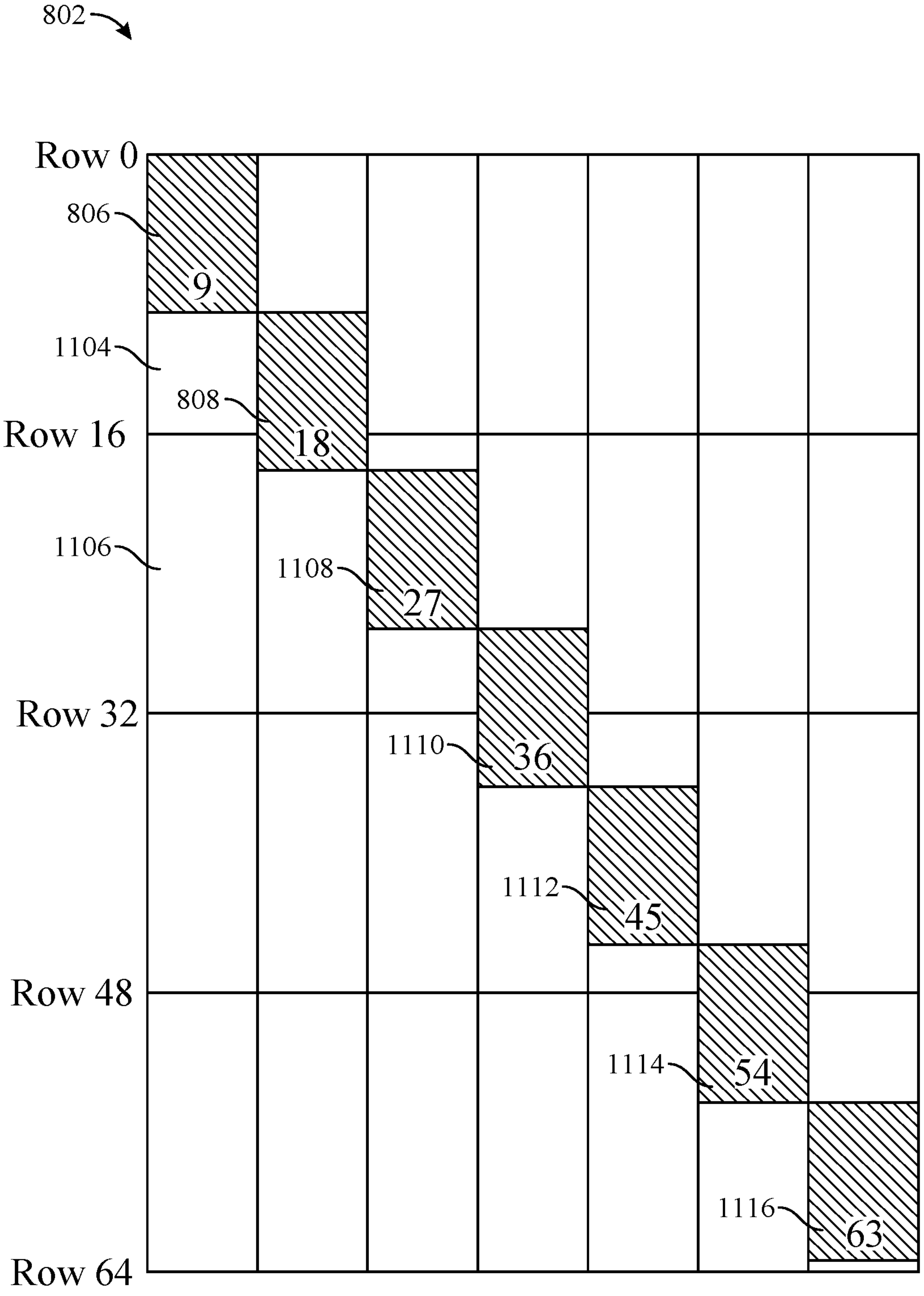
FIG. 11 illustrates a CIM array with diagonally stacked kernels, in accordance with certain aspects of the present disclosure.

FIG. 11 illustrates a CIM array 802 with diagonally stacked kernels, in accordance with certain aspects of the present disclosure. Various diagonally stacked kernels may implemented in the CIM array 802. For example, the CIM array 802 may include CIM cells for kernels 806 and 808, as discussed with respect to FIG. 8, as well as CIM cells for kernels 1108, 1110, 1112, 1114, 1116, each implemented on different rows and columns of the CIM array 802. As illustrated, the CIM array 802 may be partitioned into tiles, such as tiles 1104, 1106. Each of the tiles (e.g., tile 1106) of the CIM array that does not include at least a portion of a kernel may be deactivated to save power.

In some aspects, a relatively small tile size may be used (e.g., selected during chip-design) for a CIM bank that runs DW convolution (e.g., 16 rows and 32 columns) to increase CIM array utilization and save power. Using smaller a tile size increases the utilization of active CIM cells, active CIM cells being cells that are not part of a disabled tile.

As an example, three CIM cell groups may be designed to run a neural network architecture inverse bottleneck. Inverse bottleneck operations generally refer to operations used to expand input features, followed by a DW convolution and reduction of DW output dimension via PW convolution. A first CIM cell group (CIM1) may be used for a bottleneck operation, a second CIM cell group (CIM2) may be used for DW convolution operation, a third CIM cell group (CIM3) may be used for the bottleneck operation. In some aspects, CIM2 for DW convolution may have finer tiling arrangement (e.g., 16 rows to implement 3×3 kernel, or 32 rows to implement a 5×5 kernel) to improve CIM array utilization and saver power, while CIM1 and CIM3 may have coarse grain tiling (e.g. 64 or 128 rows) to avoid the impact of filler cells for non-DW convolution operations (e.g., since using smaller tiles for a CIM array results in a greater number of filler cells for the CIM array). In this manner, the CIM array library's reusability may be doubled for DW and non-DW operations.

As an example, the average (e.g., approximate) CIM utilization with coarse grain tiling (e.g., where each tile uses 64 rows and 32 columns of a CIM array having 1024 rows), may be 13.08% for 3×3 kernels, and 31.44% for 5×5 kernels. In other words, only 13.08% of active memory cells in the CIM array may be utilized for 3×3 kernels, and 31.44% of active memory cells the CIM array may be utilized for 5×5 kernels. On the other hand, average CIM utilization with fine grain tiling using 16 rows and 32 columns per tile, and with the CIM array having 1024 rows may be 40.46% for 3×3 kernels, and 47.64% for 5×5 kernels. Average CIM utilization with fine grain tiling using 32 rows and 32 columns per tile of a CIM array having 1024 rows may be 24.18% for 3×3 kernels, and 47.64% for 5×5 kernels. Thus, fine tiling improves CIM array utilization for smaller kernel size filters (e.g., for DW convolution). Improving CIM array utilization results in a higher percentage of active memory cells to be utilized, reducing power loss that would be caused by active memory cells that are not utilized.

In some aspects, utilization may be improved by choosing the tiling size closer to the kernel size. For example, as illustrated in FIG. 11, a tile size of 16 (e.g., as shown for tile 1104) may be used for a kernel size of 9 (e.g., 9 rows, as shown for kernel 806). The tile size may be a power of 2 (log scale) greater than the kernel size to improve flexibility to handle different neural network models. In some aspects, kernels may be repeated to improve row utilization and improve ADC SNR, as described in more detail with respect to FIG. 12.

Figure 12:
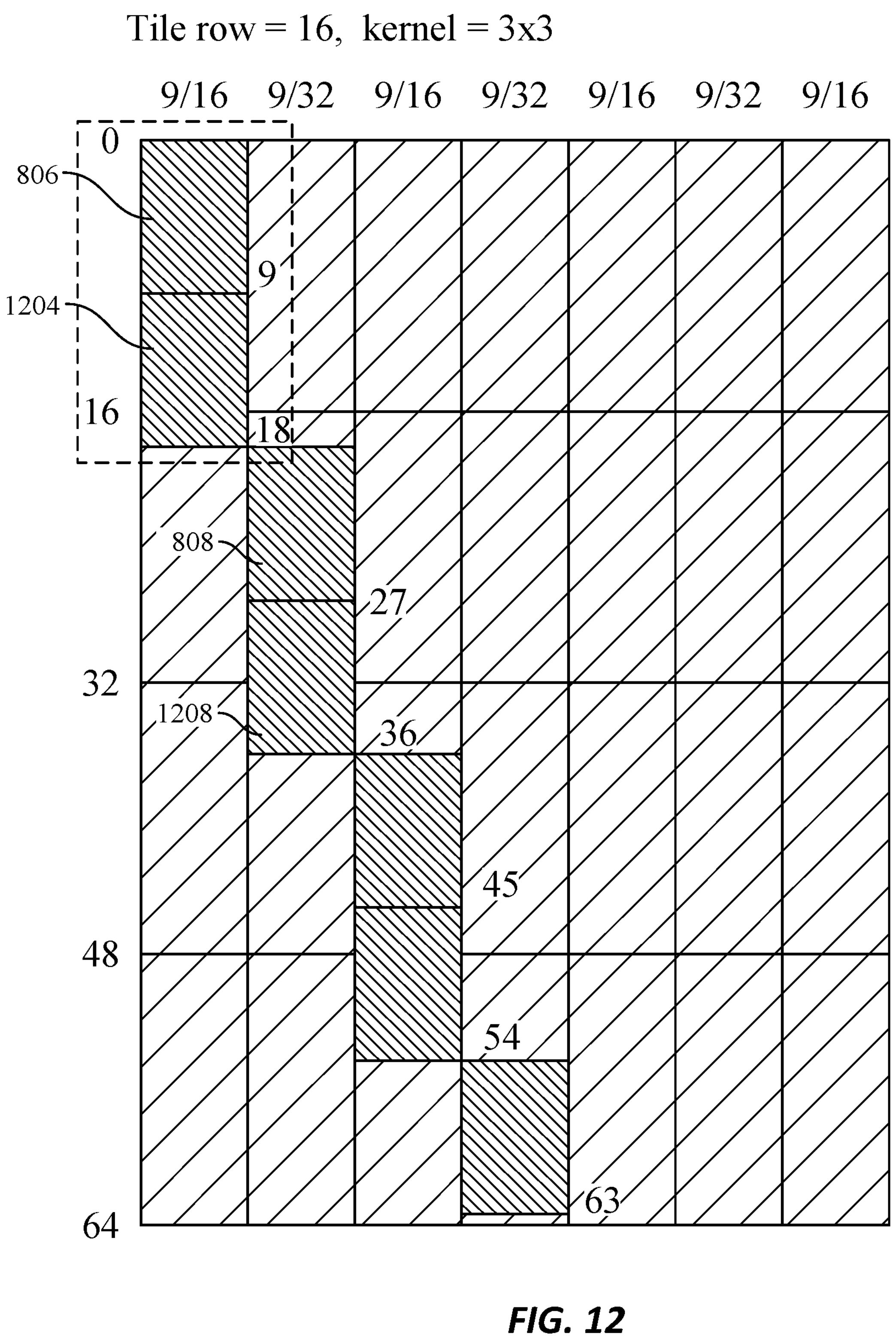
FIG. 12 illustrates a CIM array implemented with repeated kernels, in accordance with certain aspects of the present disclosure.

FIG. 12 illustrates a CIM array implemented with repeated kernels, in accordance with certain aspects of the present disclosure.

As illustrated, multiple kernels may be repeated to form a kernel group. For example, multiple kernels may be implemented on the same columns, such as the kernels 806, 1204, or kernels 808, 1208. The same weight parameters may be stored in the repeated kernels (e.g., kernels 806, 1204) of a kernel group on the same column, and the same activation inputs may be provided to the repeated kernels. Therefore, the repeated kernels may generate the same output signals that are combined at each column (output), resulting in an increase of the dynamic range at the output for the repeated kernels. For example, using two repeated kernels may result in the doubling of the dynamic range at the output of the repeated kernels that is provided to an ADC (e.g., ADC 840). Increasing the dynamic range at the output of the kernels facilitates analog to digital conversion with higher accuracy because it may take advantage of a wider range of the ADC. In other words, using the entire range of the ADC input allows the digital output of the ADC to more accurately identify the analog input of the ADC and improve the SNR of the ADC.

In some cases, the number of DW convolution channels that may be implemented in a CIM array may be limited by the dimensions of the CIM array. For example, 113 channels may be implemented for a CIM array with 1024 rows (e.g., since 113×9 is less than 1024) if implementing 3×3 filters. In other words, DW kernels for a DW convolution may not fit into one CIM array due to row or column number limitations associated with the CIM array. Thus, input activation and DW convolution weights may be arranged by a sequencer so that partial DW convolution channel sums may be calculated.

In some cases, the maximum number of kernels that can be implemented in a CIM array may be less than the total number of kernels for all channels. The maximum number of kernels may be implemented in the CIM array. All corresponding channel inputs may be then processed to generate partial channel outputs. The array may be then loaded with the next batch of kernels, and partial outputs may be processed until all kernels are processed. As another example, a DW convolution input batch size may be determined based on a subsequent PW layer dimension information. The kernel may be loaded multiple times to process the input batch size. Then the partial DW output may be fed to the next PW convolution layer to generate a partial bottleneck output.

Example Operations for Performing Neural Network Processing in a CIM Array

FIG. 13 is a flow diagram illustrating example operations 1300 for signal processing in a neural network, in accordance with certain aspects of the present disclosure. The operations 1300 may be performed by a controller, such as a CIM controller 1432 as described with respect to FIG. 14.

The operations 1300 begin at block 1305 by the controller loading, via one or more first columns (e.g., 810, 812 of FIG. 8), a first set of compute-in memory (CIM) cells with a first plurality of weight parameters for a first kernel (e.g., kernel 806 of FIG. 8) to perform a neural network computation (e.g., DW neural network computation), the first set of CIM cells having the one or more first columns and a first plurality of rows (e.g., rows 814 of FIG. 8) of a CIM array (e.g., CIM array 802 of FIG. 8). At block 1310, the controller loads, via one or more second columns (e.g., columns 816, 818 of FIG. 8), a second set of CIM cells with a second plurality of weight parameters of a second kernel (e.g., kernel 808 of FIG. 8) to perform the neural network computation, the second set of CIM cells having the one or more second columns and a second plurality of rows (e.g., rows 820 of FIG. 8) of the CIM array. For example, the first set of CIM cells may include a subset of cells of the CIM array and the second set of CIM cells includes another subset of cells of the CIM array. In some aspects, the one or more first columns may be different than the one or more second columns, and the first plurality of rows may be different than the second plurality of rows. At block 1315, the controller may perform the neural network computation by applying first activation inputs to the first plurality of rows and second activation inputs to the second plurality of rows.

In some aspects, the operations 1300 may also include loading another CIM array (e.g., CIM array 804 of FIG. 8) with a third plurality of weights for a third kernel to perform a pointwise neural network computation. The controller may also generate input signals (e.g., provided via input activation buffers 860 of FIG. 8) to the second CIM array based on output signals from the depthwise neural network computation.

In some aspects, the operations 1300 may also include generating a first digital signal (e.g., via ADC 840 of FIG. 8) by converting a voltage at the one or more first columns from an analog domain to a digital domain, and generating a second digital (e.g., ADC 842 of FIG. 8) signal by converting a voltage at the one or more second columns from the analog domain to the digital domain. The operations 1300 may also include performing a nonlinear activation operation (e.g., via nonlinear activation circuit 850) based on first digital signal and the second digital signal.

In some aspects, kernels may be repeated to improve CIM array utilization and increase the input range compression for ADCs. For example, the controller may also loading, via the one or more first columns, third CIM cells with the first plurality of weight parameters for a third kernel (e.g., kernel 1204 of FIG. 12) to perform the neural network computation. The third CIM cells may be on the one or more first columns and a third plurality of rows of the CIM array. The controller may perform the neural network computation by at least applying the first activation inputs (e.g., same activation inputs provided to the first kernel) to the third plurality of rows. As described herein, each bit of a weight parameter may be stored via a column of a kernel. For example, a quantity of the one or more first columns may be associated with a quantity of one or more bits of each of the first plurality of weight parameters, and a quantity of the one or more second columns may be associated with a quantity of one or more bits of each of the second plurality of weight parameters.

Example Processing Systems for Performing Phase Selective Convolution

Figure 14:
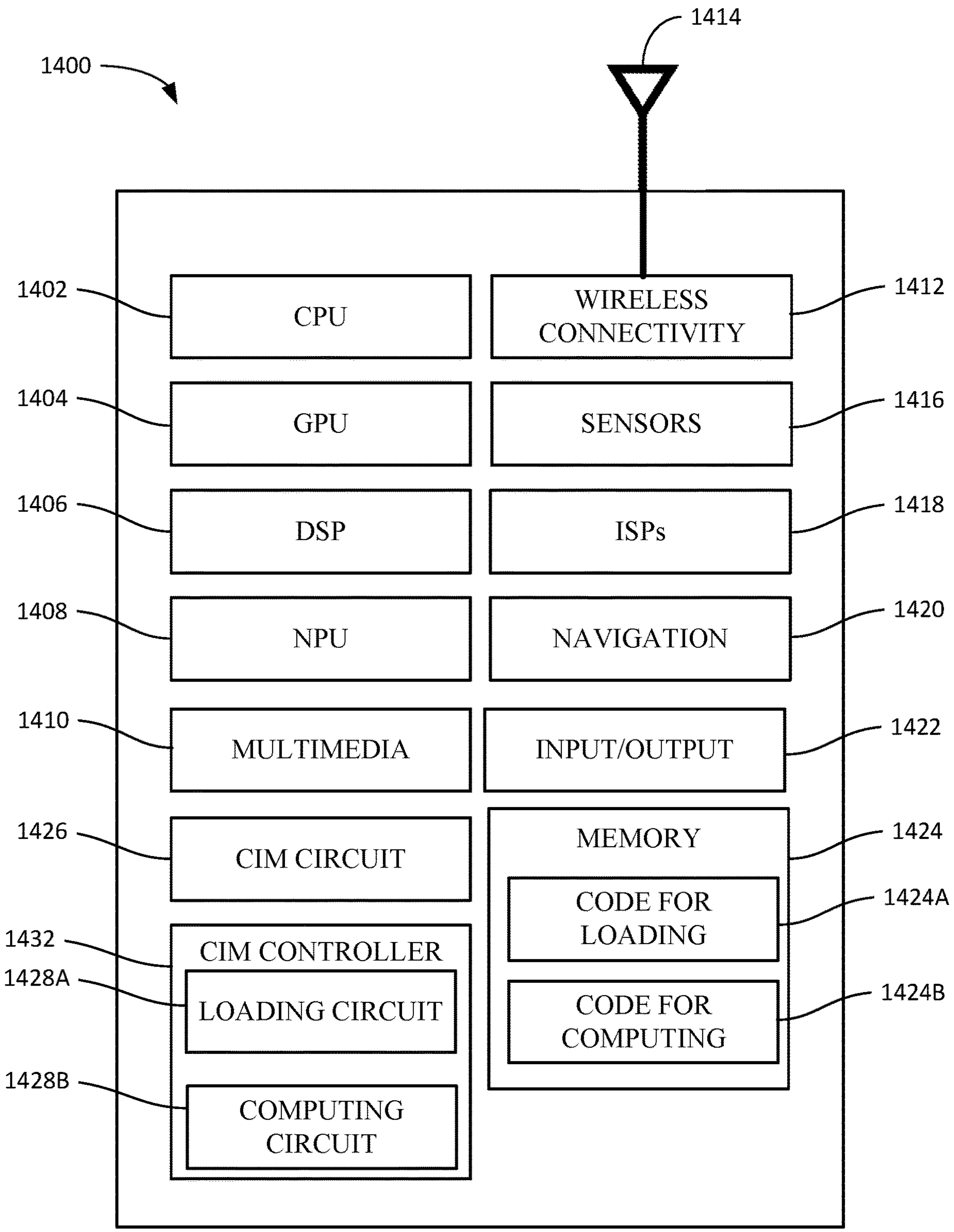
FIG. 14 illustrates an example electronic device configured to perform operations for signal processing in a neural network, in accordance with certain aspects of the present disclosure.

FIG. 14 illustrates an example electronic device 1400. Electronic device 1400 may be configured to perform the methods described herein, including operations 1300 described with respect to FIG. 13.

Electronic device 1400 includes a central processing unit (CPU) 1402, which in some aspects may be a multi-core CPU. Instructions executed at the CPU 1402 may be loaded, for example, from a program memory associated with the CPU 1402 or may be loaded from a memory 1424.

Electronic device 1400 also includes additional processing blocks tailored to specific functions, such as a graphics processing unit (GPU) 1404, a digital signal processor (DSP) 1406, a neural processing unit (NPU) 1408, a multimedia processing block 1410, a multimedia processing block 1410, and a wireless connectivity processing block 1412. In one implementation, NPU 1408 is implemented in one or more of CPU 1402, GPU 1404, and/or DSP 1406.

In some aspects, wireless connectivity processing block 1412 may include components, for example, for third generation (3G) connectivity, fourth generation (4G) connectivity (e.g., 4G LTE), fifth generation connectivity (e.g., 5G or NR), Wi-Fi connectivity, Bluetooth connectivity, and wireless data transmission standards. Wireless connectivity processing block 1412 is further connected to one or more antennas 1414 to facilitate wireless communication.

Electronic device 1400 may also include one or more sensor processors 1416 associated with any manner of sensor, one or more image signal processors (ISPs) 1418 associated with any manner of image sensor, and/or a navigation processor 1420, which may include satellite-based positioning system components (e.g., GPS or GLONASS) as well as inertial positioning system components.

Electronic device 1400 may also include one or more input and/or output devices 1422, such as screens, touch-sensitive surfaces (including touch-sensitive displays), physical buttons, speakers, microphones, and the like. In some aspects, one or more of the processors of electronic device 1400 may be based on an ARM instruction set.

Electronic device 1400 also includes memory 1424, which is representative of one or more static and/or dynamic memories, such as a dynamic random access memory, a flash-based static memory, and the like. In this example, memory 1424 includes computer-executable components, which may be executed by one or more of the aforementioned processors of electronic device 1400 or a CIM controller 1432. For example, the electronic device 1400 may include a CIM circuit 1426 including one or more CIM arrays, such as the CIM array 802 and CIM array 804, as described herein. The CIM circuit 1426 may controlled via the CIM controller 1432. For instance, in some aspects, memory 1424 may includes code 1424A for loading (e.g., loading CIM cells with weight parameters), code 1424B for computing (e.g., performing a neural network computation by applying activation inputs). As illustrated, the CIM controller 1432 may include a circuit 1428A for loading (e.g., loading CIM cells with weight parameters), and a circuit 1428B for computing (e.g., performing a neural network computation by applying activation inputs). The depicted components, and others not depicted, may be configured to perform various aspects of the methods described herein.

In some aspects, such as where electronic device 1400 is a server device, various aspects may be omitted from the aspect depicted in FIG. 14, such as one or more of multimedia component 1410, wireless connectivity component 1412, antenna 1414, sensors 1416, ISPs 1418, or navigation 1420.

Example Clauses

Aspect 1. An apparatus for signal processing in a neural network, comprising: first computation in memory (CIM) cells configured as a first kernel for a neural network computation, the first set of CIM cells comprising on one or more first columns and a first plurality of rows of a CIM array; and a second set of CIM cells configured as a second kernel for the neural network computation, the second set of CIM cells comprising on one or more second columns and a second plurality of rows of the CIM array, wherein: the one or more first columns are different than the one or more second columns, and the first plurality of rows are different than the second plurality of rows.

Aspect 2. The apparatus of aspect 1, wherein the first set of CIM cells includes a subset of cells of the CIM array and the second set of CIM cells includes another subset of cells of the CIM array.

Aspect 3. The apparatus of any one of aspects 1-2, wherein the neural network computation comprises a depthwise (DW) neural network computation.

Aspect 4. The apparatus of aspect 3, further comprising: another CIM array configured as a third kernel for a pointwise (PW) neural network computation, wherein input signals to the other CIM array are generated based on output signals from the CIM array.

Aspect 5. The apparatus of any one of aspects 1-4, further comprising: a first analog-to-digital converter (ADC) coupled to the one or more first columns; and a second ADC coupled to the one or more second columns.

Aspect 6. The apparatus of aspect 5, further comprising a nonlinear activation circuit coupled to outputs of the first ADC and the second ADC.

Aspect 7. The apparatus of any one of aspects 1-6, further comprising third CIM cells configured as a third kernel for the neural network computation, the third CIM cells being on the one or more first columns and a third plurality of rows of the CIM array.

Aspect 8. The apparatus of aspect 7, wherein the same weight parameters are configured to be stored in the first set of CIM cells and the third CIM cells.

Aspect 9. The apparatus of any one of aspects 1-8, wherein: one or more of the first set of CIM cells on each row of the first plurality of rows is configured to store a first weight parameter; and one or more of the second set of CIM cells on each row of the second plurality of rows is configured to store a second weight parameter.

Aspect 10. The apparatus of aspect 9, wherein: a quantity of the one or more first columns is associated with a quantity of one or more bits of the first weight parameter; and a quantity of the one or more second columns is associated with a quantity of one or more bits of the second weight parameter.

Aspect 11. A method for signal processing in neural network, comprising: loading, via one or more first columns, first computation in memory (CIM) cells with a first plurality of weight parameters for a first kernel to perform a neural network computation, the first set of CIM cells comprising the one or more first columns and a first plurality of rows of a CIM array; loading, via one or more second columns, a second set of CIM cells with a second plurality of weight parameters of a second kernel to perform the neural network computation, the second set of CIM cells comprising the one or more second columns and a second plurality of rows of the CIM array, wherein the one or more first columns are different than the one or more second columns, and wherein the first plurality of rows are different than the second plurality of rows; and performing the neural network computation by applying first activation inputs to the first plurality of rows and second activation inputs to the second plurality of rows.

Aspect 12. The method of aspect 11, wherein the first set of CIM cells includes a subset of cells of the CIM array and the second set of CIM cells includes another subset of cells of the CIM array.

Aspect 13. The method of any one of aspects 11-12, wherein the neural network computation comprises a depthwise (DW) neural network computation.

Aspect 14. The method of aspect 13, further comprising: loading another CIM array with a third plurality of weights for a third kernel to perform a pointwise (PW) neural network computation; and generating input signals to the other CIM array based on output signals from the DW neural network computation.

Aspect 15. The method of any one of aspects 11-14, further comprising: generating a first digital signal by converting a voltage at the one or more first columns from an analog domain to a digital domain; and generating a second digital signal by converting a voltage at the one or more second columns from the analog domain to the digital domain.

Aspect 16. The method of aspect 15, further comprising performing a nonlinear activation operation based on first digital signal and the second digital signal.

Aspect 17. The method of any one of aspects 11-16, further comprising: loading, via the one or more first columns, third CIM cells with the first plurality of weight parameters for a third kernel to perform the neural network computation, the third CIM cells being on the one or more first columns and a third plurality of rows of the memory, wherein performing the neural network computation further comprises applying the first activation inputs to the third plurality of rows.

Aspect 18. The method of any one of aspects 11-17, wherein: a quantity of the one or more first columns is associated with a quantity of one or more bits of each of the first plurality of weight parameters; and a quantity of the one or more second columns is associated with a quantity of one or more bits of each of the second plurality of weight parameters.

Aspect 19. A non-transistor computer-readable medium comprising instructions that, when executed by one or more processors of a processing system, cause the processing system to perform a method of signal processing in neural network, the method comprising: loading, via one or more first columns, first computation in memory (CIM) cells with a first plurality of weight parameters for a first kernel to perform a neural network computation, the first set of CIM cells comprising the one or more first columns and a first plurality of rows of a CIM array; loading, via one or more second columns, a second set of CIM cells with a second plurality of weight parameters of a second kernel to perform the neural network computation, the second set of CIM cells comprising the one or more second columns and a second plurality of rows of the CIM array, wherein the one or more first columns are different than the one or more second columns, and wherein the first plurality of rows are different than the second plurality of rows; and performing the neural network computation by applying first activation inputs to the first plurality of rows and second activation inputs to the second plurality of rows.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus, comprising:

a first set of computation in memory (CIM) cells configured as a first kernel for a neural network computation, the first set of CIM cells comprising one or more first columns and a first plurality of rows of a first CIM array;

a second set of CIM cells configured as a second kernel for the neural network computation, the second set of CIM cells comprising one or more second columns and a second plurality of rows of the first CIM array, wherein:

the one or more first columns are different than the one or more second columns, the first plurality of rows are different than the second plurality of rows, an entirety of the first kernel and an entirety of the second kernel are stored on different rows and columns, the first kernel and the second kernel being part of a same depthwise (DW) convolution filter for a multi-channel input, wherein a quantity of kernels of the DW convolution filter corresponds to a quantity of channels of the multi-channel input, and wherein the convolution of the multi-channel input with the DW convolution filter generates a feature map having the quantity of channels;

a first analog-to-digital converter (ADC) coupled to the one or more first columns configured to store the first kernel;

a second ADC coupled to the one or more second columns configured to store the second kernel, the first ADC being separate from the second ADC to perform at least partly parallel analog-to-digital conversions for the one or more first columns and the one or more second columns, respectively;

a nonlinear activation circuit coupled to outputs of the first ADC and the second ADC, wherein the neural network computation comprises a depth-wise (DW) neural network computation based on the same filter; and a second CIM array configured as a third kernel for a pointwise (PW) neural network computation, the second CIM array for the PW neural network computation is separate from the first CIM array for the DW neural network computation, wherein input signals to the second CIM array are generated based on output signals from the first CIM array.

2. The apparatus of claim 1, wherein the first set of CIM cells includes a subset of cells of the first CIM array and wherein the second set of CIM cells includes another subset of cells of the first CIM array.

3. The apparatus of claim 1, further comprising a third set of CIM cells configured as a fourth kernel for the neural network computation, the third set of CIM cells being on the one or more first columns and a third plurality of rows of the first CIM array.

4. The apparatus of claim 3, wherein the same weight parameters are configured to be stored in the first set of CIM cells and the third set of CIM cells.

5. The apparatus of claim 1, wherein:

one or more of the first set of CIM cells on each row of the first plurality of rows is configured to store a first weight parameter; and one or more of the second set of CIM cells on each row of the second plurality of rows is configured to store a second weight parameter.

6. The apparatus of claim 5, wherein:

a quantity of the one or more first columns is associated with a quantity of one or more bits of the first weight parameter; and a quantity of the one or more second columns is associated with a quantity of one or more bits of the second weight parameter.

7. A method, comprising:

loading, via one or more first columns, a first set of computation in memory (CIM) cells with a first plurality of weight parameters for a first kernel to perform a neural network computation, the first set of CIM cells comprising the one or more first columns and a first plurality of rows of a first CIM array;

loading, via one or more second columns, a second set of CIM cells with a second plurality of weight parameters of a second kernel to perform the neural network computation, the second set of CIM cells comprising the one or more second columns and a second plurality of rows of the first CIM array, wherein the one or more first columns are different than the one or more second columns, and wherein the first plurality of rows are different than the second plurality of rows, wherein an entirety of the first kernel and an entirety of the second kernel are stored on different rows and columns, the first kernel and the second kernel being part of a same depthwise (DW) convolution filter for a multi-channel input, wherein a quantity of kernels of the DW convolution filter corresponds to a quantity of channels of the multi-channel input, and wherein the convolution of the multi-channel input with the DW convolution filter generates a feature map having the quantity of channels;

performing the neural network computation by applying first activation inputs to the first plurality of rows and second activation inputs to the second plurality of rows;

generating a first digital signal by converting a voltage at the one or more first columns storing the first kernel from an analog domain to a digital domain via a first analog-to-digital converter (ADC);

generating a second digital signal by converting a voltage at the one or more second columns storing the second kernel from the analog domain to the digital domain via a second ADC, the first ADC being separate from the second ADC to generate the first digital signal and the second digital signal at least partly in parallel;

performing a nonlinear activation operation based on the first digital signal and the second digital signal, wherein the neural network computation comprises a depthwise (DW) neural network computation based on the same filter;

loading a second CIM array with a third plurality of weights for a third kernel to perform a pointwise (PW) neural network computation, wherein the second CIM array for the PW neural network computation is separate from the first CIM array for the DW neural network computation; and generating input signals to the second CIM array based on output signals from the DW neural network computation.

8. The method of claim 7, wherein the first set of CIM cells includes a subset of cells of the first CIM array and wherein the second set of CIM cells includes another subset of cells of the first CIM array.

9. The method of claim 7, further comprising loading, via the one or more first columns, a third set of CIM cells with the first plurality of weight parameters for a fourth kernel to perform the neural network computation, the third set of CIM cells being on the one or more first columns and a third plurality of rows of the memory, wherein performing the neural network computation further comprises applying the first activation inputs to the third plurality of rows.

10. The method of claim 7, wherein:

a quantity of the one or more first columns is associated with a quantity of one or more bits of each of the first plurality of weight parameters; and a quantity of the one or more second columns is associated with a quantity of one or more bits of each of the second plurality of weight parameters.

11. A non-transitory computer-readable medium comprising instructions that, when executed by one or more processors of a processing system, cause the processing system to perform a method, the method comprising:

loading, via one or more first columns, a first set of computation in memory (CIM) cells with a first plurality of weight parameters for a first kernel to perform a neural network computation, the first set of CIM cells comprising the one or more first columns and a first plurality of rows of a first CIM array;

loading, via one or more second columns, a second set of CIM cells with a second plurality of weight parameters of a second kernel to perform the neural network computation, the second set of CIM cells comprising the one or more second columns and a second plurality of rows of the first CIM array, wherein the one or more first columns are different than the one or more second columns, and wherein the first plurality of rows are different than the second plurality of rows, wherein an entirety of the first kernel and an entirety of the second kernel are stored on different rows and columns, the first kernel and the second kernel being part of a same depthwise (DW) convolution filter for a multi-channel input, wherein a quantity of kernels of the DW convolution filter corresponds to a quantity of channels of the multi-channel input, and wherein the convolution of the multi-channel input with the DW convolution filter generates a feature map having the quantity of channels;

performing the neural network computation by applying first activation inputs to the first plurality of rows and second activation inputs to the second plurality of rows;

generating a first digital signal by converting a voltage at the one or more first columns configured to store the first kernel from an analog domain to a digital domain via a first analog-to-digital converter (ADC);

generating a second digital signal by converting a voltage at the one or more second columns configured to store the second kernel from the analog domain to the digital domain via a second ADC, the first ADC being separate from the second ADC to generate the first digital signal and the second digital signal at least partly in parallel;

performing a nonlinear activation operation based on the first digital signal and the second digital signal, wherein the neural network computation comprises a depthwise (DW) neural network computation based on the same filter;

loading a second CIM array with a third plurality of weights for a third kernel to perform a pointwise (PW) neural network computation, wherein the second CIM array for the PW neural network computation is separate from the first CIM array for the DW neural network computation; and generating input signals to the second CIM array based on output signals from the DW neural network computation.

* * * * *